US011800655B2

(12) United States Patent
Liu et al.

(10) Patent No.: US 11,800,655 B2
(45) Date of Patent: Oct. 24, 2023

(54) LED DISPLAY DEVICE

(71) Applicant: SHENZHEN LEYARD OPTO-ELECTRONIC CO., LTD., Guangdong (CN)

(72) Inventors: Ming Liu, Guangdong (CN); Xuechao Sun, Guangdong (CN)

(73) Assignee: SHENZHEN LEYARD OPTO-ELECTRONIC CO., LTD., Shenzhen (CN)

( * ) Notice: Subject to any disclaimer, the term of this patent is extended or adjusted under 35 U.S.C. 154(b) by 0 days.

(21) Appl. No.: 17/941,042

(22) Filed: Sep. 9, 2022

(65) Prior Publication Data
US 2023/0096344 A1    Mar. 30, 2023

(30) Foreign Application Priority Data
Sep. 29, 2021   (CN) .......................... 202111155852.4

(51) Int. Cl.
*H05K 5/02*     (2006.01)
*H05K 5/00*     (2006.01)
(Continued)

(52) U.S. Cl.
CPC ......... *H05K 5/0208* (2013.01); *H05K 5/0018* (2022.08); *H05K 5/0217* (2013.01); *G09F 9/33* (2013.01); *H05K 5/061* (2013.01)

(58) Field of Classification Search
CPC .. H05K 5/0208; H05K 5/0018; H05K 5/0217; H05K 5/061; G09F 9/33
See application file for complete search history.

(56) References Cited

U.S. PATENT DOCUMENTS 10,653,021 B2 *   5/2020   Kim ..................... F16B 21/086
11,048,308 B2 *   6/2021   Hao .................... F16M 11/041
(Continued)

FOREIGN PATENT DOCUMENTS

CN    209765922 U    12/2019
EP    3734087 A1     11/2020

OTHER PUBLICATIONS

The extended European search report of the corresponding EP patent application No. 22196407.5, dated Mar. 9, 2023.

*Primary Examiner* — Sagar Shrestha
(74) *Attorney, Agent, or Firm* — Gang Yu

(57) ABSTRACT

Provided is a Light Emitting Diode (LED) display device. The LED display device includes: a rectangle framework, including a frame, a first transverse beam and a second transverse beam arranged inside the frame at intervals, an adapter plate assembly, including a fixed plate mounted at a strip-like gap and an adapter plate detachably arranged on a rear side of the fixed plate, the fixed plate being provided with a lock, a display module, mounted on a front side of the rectangle framework through a magnetic attraction structure, a rear side of the display module being provided with a first strip-shaped lock hole, wherein, the lock includes a rotary shaft rotatably arranged on the fixed plate and a first lock tongue arranged on the rotary shaft, the first lock tongue is able to go through the first strip-shaped lock hole and has a first unlocking position corresponding to the first strip-shaped lock hole and a first locking position that is staggered with the first strip-shaped lock hole, and the adapter plate fits the display module through a connector in a plugging-in manner. The technical solution of the application effectively solves a problem that a display module in a related art falls due to separation from a box body.

10 Claims, 17 Drawing Sheets

(51) Int. Cl.
  *G09F 9/33* (2006.01)
  *H05K 5/06* (2006.01)

(56) References Cited

U.S. PATENT DOCUMENTS

| | | | | |
|---|---|---|---|---|
| 11,184,986 | B2* | 11/2021 | Heo | H05K 5/0008 |
| 2016/0210886 | A1* | 7/2016 | Brashnyk | F16M 11/041 |
| 2017/0202098 | A1* | 7/2017 | Gou | H05K 5/0204 |
| 2020/0205305 | A1* | 6/2020 | Kim | F16M 11/041 |
| 2020/0284074 | A1* | 9/2020 | Zhang | H10K 59/00 |
| 2021/0274661 | A1* | 9/2021 | Zhang | H05K 5/0017 |
| 2021/0378111 | A1* | 12/2021 | Hao | G09F 9/33 |
| 2022/0022330 | A1* | 1/2022 | Dewaele | F16M 11/18 |
| 2022/0053652 | A1* | 2/2022 | Chen | G09F 9/33 |
| 2022/0408577 | A1* | 12/2022 | Zhang | H05K 5/0226 |

* cited by examiner rear ← → front rear ← → front

LED DISPLAY DEVICE

CROSS-REFERENCE TO RELATED APPLICATION

The present disclosure claims the priority to Chinese Patent Application No. 202111155852.4, filed to the Chinese Patent Office on Sep. 29, 2021 and entitled "LED Display Device", which is incorporated in its entirety herein by reference.

TECHNICAL FIELD

The disclosure relates to a technical field of Light Emitting Diode (LED) display, and in particular to an LED display device.

BACKGROUND

An LED display device with small-spacing needs to be designed with a function of maintenance from a front side and from a rear side, and the display device includes a box body, a display module arranged on a front side of the box body and an adapter plate detachably arranged on a rear side of the box body. The display module is detachably mounted on the box body through a magnetic attraction structure, and the adapter plate fits the display module through a connector in a plugging-in manner.

However, after maintenance of the adapter plate from the rear side, when the adapter plate fits the display module in the plugging-in manner, pushing force applied onto the adapter plate is transmitted onto the display module through the connector. When the pushing force is greater than magnetic attraction force of the magnetic attraction structure, the display module will be damaged after falling due to separation from the box body.

SUMMARY

A main objective of the disclosure is to provide a Light Emitting Diode (LED) display device, as to solve a problem that a display module in a related art falls due to separation from a box body.

To achieve the above objective, the disclosure provides an LED display device, including: a rectangle framework including a frame, a first transverse beam and a second transverse beam arranged inside the frame at intervals, a strip-like gap being formed by the first transverse beam, the second transverse beam and a part of the frame, an adapter plate assembly including a fixed plate mounted at the strip-like gap and an adapter plate detachably arranged on a rear side of the fixed plate, the fixed plate being provided with a lock, a display module, mounted on a front side of the rectangle framework through a magnetic attraction structure, a rear side of the display module being provided with a first strip-shaped lock hole, herein, the lock includes a rotary shaft rotatably arranged on the fixed plate and a first lock tongue arranged on the rotary shaft, the first lock tongue is able to go through the first strip-shaped lock hole and has a first unlocking position corresponding to the first strip-shaped lock hole and a first locking position that is staggered with the first strip-shaped lock hole, and the adapter plate fits the display module through a connector in a plugging-in manner.

In some embodiments, the adapter plate is provided with a second strip-shaped lock hole, and the lock further includes a second lock tongue arranged on the rotary shaft. The second lock tongue is able to go through the second strip-shaped lock hole and has a second unlocking position corresponding to the second strip-shaped lock hole and a second locking position that is staggered with the second strip-shaped lock hole, wherein, the second lock tongue is located at the second unlocking position when the first lock tongue is located at the first locking position, and the second lock tongue is located at the second locking position when the first lock tongue is located at the first unlocking position.

In some embodiments, the first lock tongue is arranged on a front end of the rotary shaft, the second lock tongue is arranged on a rear end of the rotary shaft, the first strip-shaped lock hole and the second strip-shaped lock hole are arranged correspondingly, and the second lock tongue and the first lock tongue are arranged perpendicularly.

In some embodiments, the lock further includes a lock seat arranged on the fixed plate, and the rotary shaft is rotatably arranged on the lock seat. The first lock tongue is of column-shaped, and the second lock tongue is of block-shaped.

In some embodiments, the display module includes a lamp panel and a rear plate arranged on a rear side of the lamp panel. The first strip-shaped lock hole is arranged on the rear plate, the fixed plate is provided with a via hole of avoiding the connector, and the connector includes a female connector arranged on the lamp panel and a male connector arranged on the adapter plate.

In some embodiments, each of the first transverse beam and the second transverse beam include a first transverse section, a second transverse section and a third transverse section that are connected in sequence. A distance between the second transverse section of the first transverse beam and the second transverse section of the second transverse beam is greater than a distance between the first transverse section of the first transverse beam and the first transverse section of the second transverse beam, and the distance between the second transverse section of the first transverse beam and the second transverse section of the second transverse beam is greater than a distance between the third transverse section of the first transverse beam and the third transverse section of the second transverse beam.

In some embodiments, the frame includes a first vertical side section, a first transverse side section, a second vertical side section and a second transverse side section that are connected in sequence. The first transverse beam and the second transverse beam are arranged at intervals in a vertical direction. Two ends of the first transverse beam are connected with the first vertical side section and the second vertical side section respectively, two ends of the second transverse beam are connected with the first vertical side section and the second vertical side section respectively, and the strip-like gap is enclosed by the first transverse beam, the second transverse beam, a part of the first vertical side section and a part of the second vertical side section. The rectangle framework further includes a plurality of first longitudinal beams located in the frame, the plurality of first longitudinal beams are arranged at intervals along a length direction of the rectangle framework, and two ends of each first longitudinal beam are connected with the first transverse side section and the first transverse beam respectively. A first rectangle hole is enclosed by the first longitudinal beam that is nearest to the first vertical side section, a part of the first transverse beam, a part of the first vertical side section and a part of the first transverse side section, a second rectangle hole is enclosed by the first longitudinal beam that is nearest to the second vertical side section, a part of the first transverse beam, a part of the second vertical side section and a part of the first transverse side section, and a third rectangle hole is enclosed by two adjacent first longitudinal beams, a part of the first transverse beam and a part of the first transverse side section. The first rectangle hole has a same shape as that of the second rectangle hole. A minimal cross section area of the first rectangle hole is greater than a maximal cross section area of the third rectangle hole, and a diagonal distance of the first rectangle hole is greater than a width of the display module.

In some embodiments, the rectangle framework further includes a plurality of second longitudinal beams located in the frame, the plurality of second longitudinal beams are arranged at intervals along a length direction of the frame, and two ends of each second longitudinal beam are connected with the second transverse side section and the second transverse beam respectively. A fourth rectangle hole is enclosed by the second longitudinal beam that is nearest to the first vertical side section, a part of the second transverse beam, a part of the first vertical side section and a part of the second transverse side section, a fifth rectangle hole is enclosed by the second longitudinal beam that is nearest to the second vertical side section, a part of the second transverse beam, a part of the second vertical side section and a part of the second transverse side section, and a sixth rectangle hole is enclosed by two adjacent second longitudinal beams, a part of the second transverse beam and a part of the second transverse side section. The fourth rectangle hole has a same shape as that of the fifth rectangle hole. A minimal cross section area of the fourth rectangle hole is greater than a maximal cross section area of the sixth rectangle hole, and a diagonal distance of the fourth rectangle hole is greater than the width of the display module.

In some embodiments, there are a plurality of display modules and a plurality of magnetic attraction structures, and each display module is spliced on the front side of the rectangle framework through the plurality of magnetic attraction structures.

In some embodiments, a front side of the frame, a front side of the first transverse beam and a front side of the second transverse beam are provided with a plurality of fixed seats, respectively. Each of the plurality of magnetic attraction structures includes a first magnetic attraction part arranged on one fixed seat and a second magnetic attraction part arranged on the rear side of the display module. The first magnetic attraction part fits the second magnetic attraction part in a magnetic attraction manner, and front sides of the first magnetic attraction parts of the plurality of magnetic attraction structures are coplanar.

With an adoption of the technical solution of the disclosure, the LED display device includes the rectangle framework, the adapter plate assembly and the display module. The rectangle framework includes the frame, the first transverse beam and the second transverse beam that are arranged inside the frame at intervals, and the strip-like gap is enclosed by the first transverse beam, the second transverse beam and the a part of the frame. The adapter plate assembly includes the fixed plate mounted at the strip-like gap and the adapter plate detachably arranged on the rear side of the fixed plate. In this way, the strip-like gap accommodates the adapter plate assembly. Thus, a thickness of the LED display device is reduced, and the LED display device is lighter and thinner. The fixed plate is provided with the lock. The display module is mounted on the front side of the rectangle framework through the magnetic attraction structure, and the rear side of the display module is provided with the first strip-shaped lock hole. In the disclosure, the lock includes the rotary shaft rotatably arranged on the fixed plate and the first lock tongue arranged on the rotary shaft. The first lock tongue is able to go through the first strip-shaped lock hole and has the first unlocking position corresponding to the first strip-shaped lock hole and the first locking position that is staggered with the first strip-shaped lock hole, and the adapter plate fits the display module through the connector in the plugging-in manner. During maintenance of the adapter plate from a rear side, the adapter plate is maintained after being dismounted from the rear side of the fixed plate. After the maintenance of the adapter plate from the rear side, the adapter plate is mounted on the fixed plate again and needs to fit the display module on the rectangle framework through the connector in the plugging-in manner. Before the adapter plate fits the display module in the plugging-in manner through the connector, the first lock tongue is switched to the first locking position from the first unlocking position, the first lock tongue fits the first strip-shaped lock hole in a staggered manner, and the first lock tongue locks the first strip-shaped lock hole, as to lock the display module on the rectangle framework. During the adapter plate fits the display module through the connector in the plugging-in manner, pushing force applied onto the adapter plate is transmitted onto the display module through the connector. When the pushing force is greater than a magnetic attraction force of the magnetic attraction structure, the display module is firmly locked on the rectangle framework by the lock, and would not be pushed far away from the rectangle framework by the pushing force. In this way, the display module is prevented from falling, a security protection is achieved, and accordingly the adapter plate is facilitated to be mounted on the rear side of the fixed plate. Therefore, the technical solution of the disclosure effectively solves the problem that the display module in the related art falls due to separation from the box body.

BRIEF DESCRIPTION OF THE DRAWINGS

The accompanying drawings described herein are used to provide a further understanding of the disclosure, and constitute a part of the disclosure, and the exemplary embodiments of the disclosure and the description thereof are used to explain the disclosure, but do not constitute improper limitations to the disclosure. In the drawings.

Figure 1:
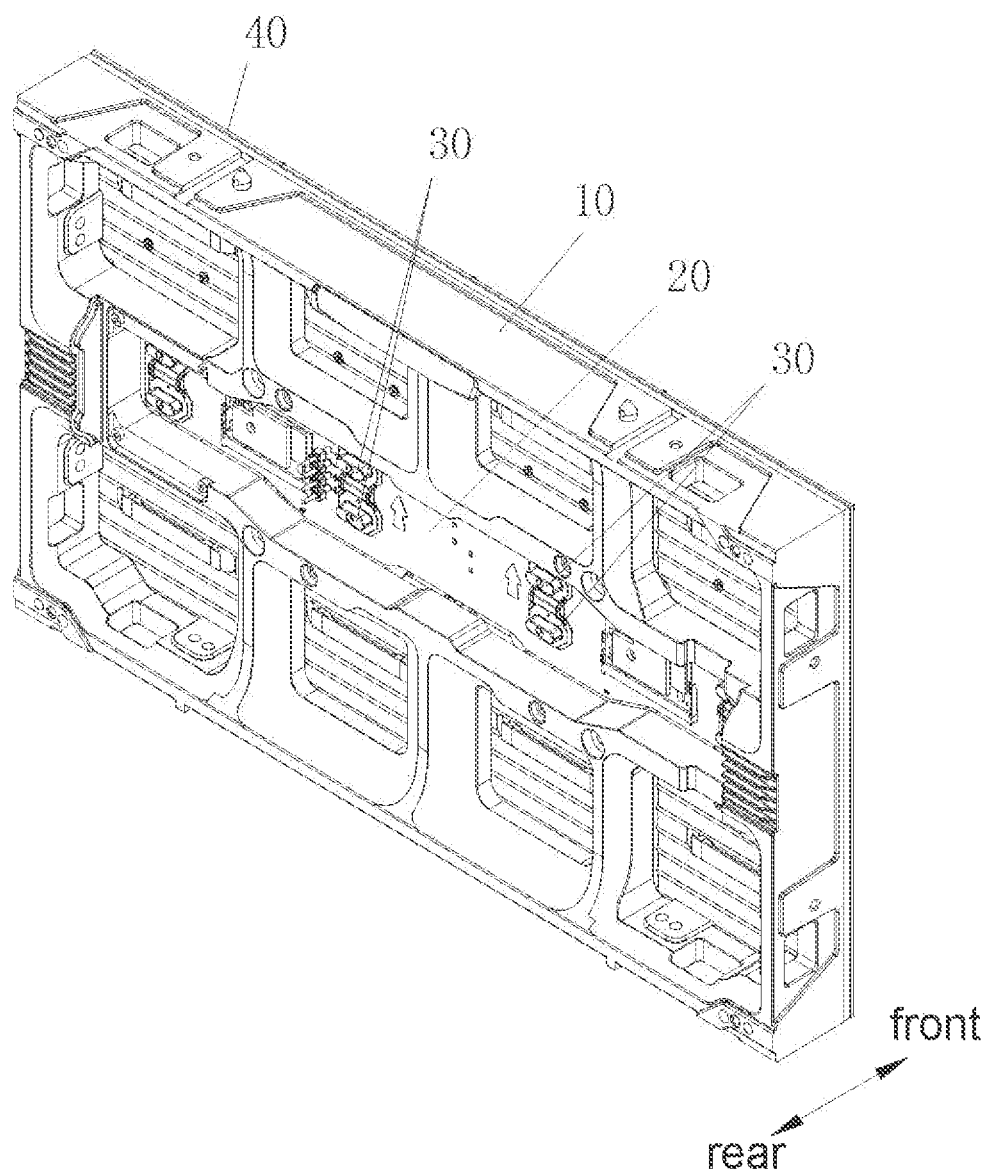
FIG. 1 shows a stereo structure diagram when a first lock tongue of an embodiment of an LED display device according to the disclosure is located at a first locking position.
Figure 2:
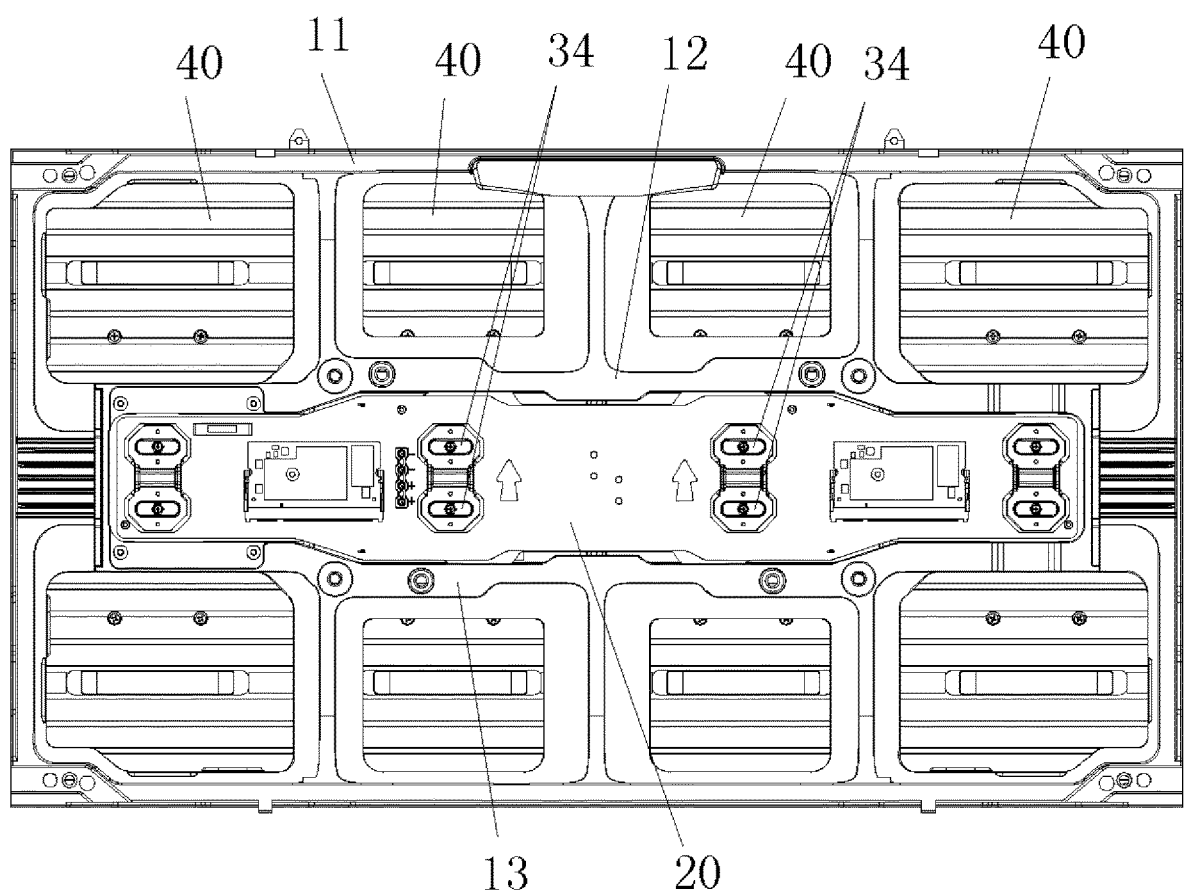
FIG. 2 shows a rear view when the first lock tongue of the LED display device of FIG. 1 is located at the first locking position.
Figure 3:
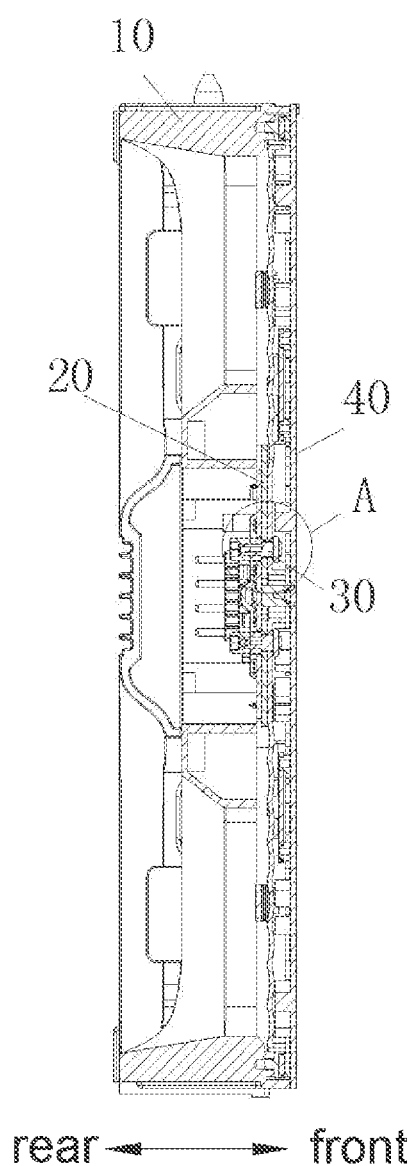
FIG. 3 shows a section view when the first lock tongue of the LED display device of FIG. 1 is located at the first locking position.
Figure 4:
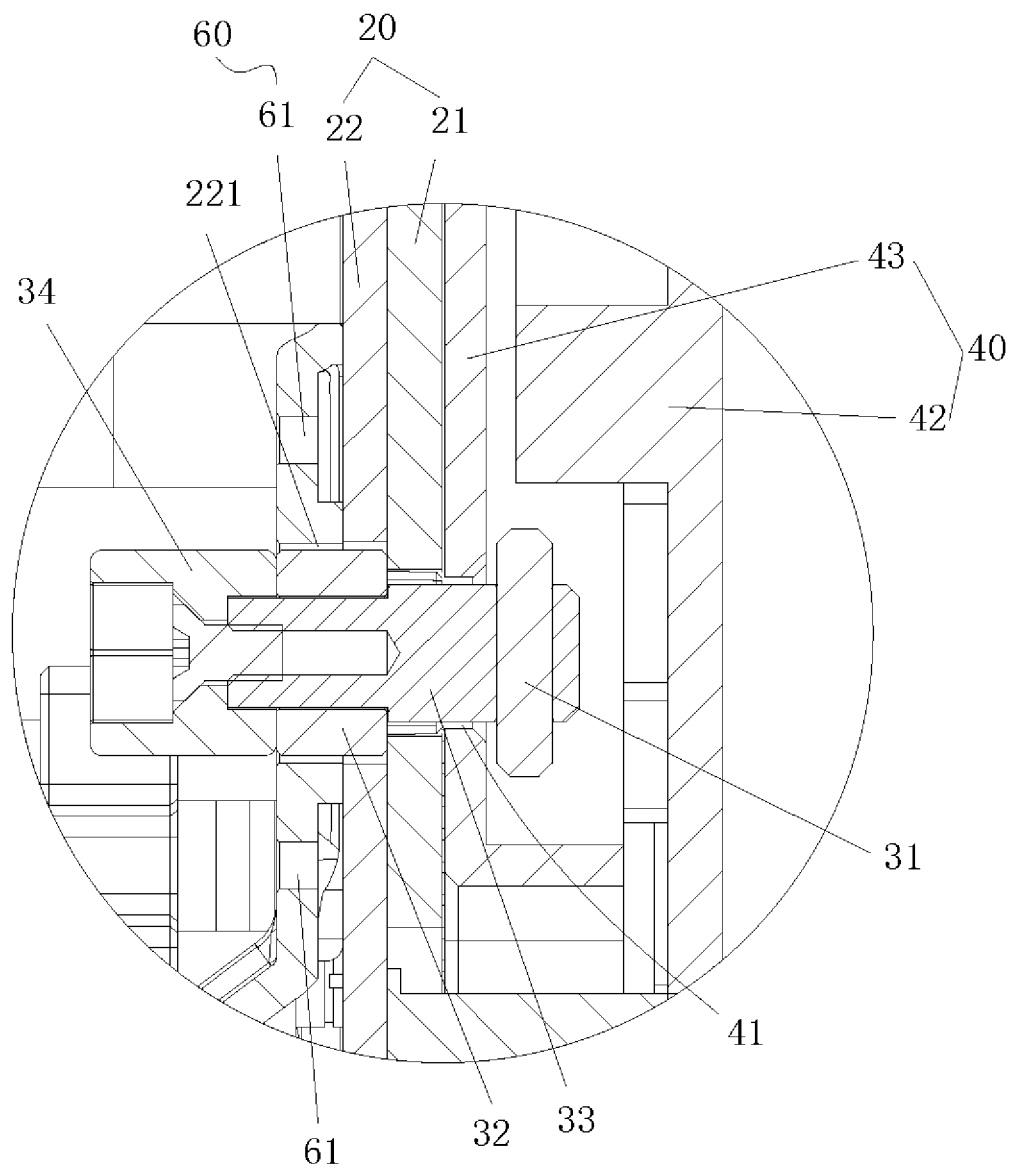
FIG. 4 shows an enlarged view of part A when the first lock tongue of the LED display device of FIG. 3 is located at the first locking position.
Figure 5:
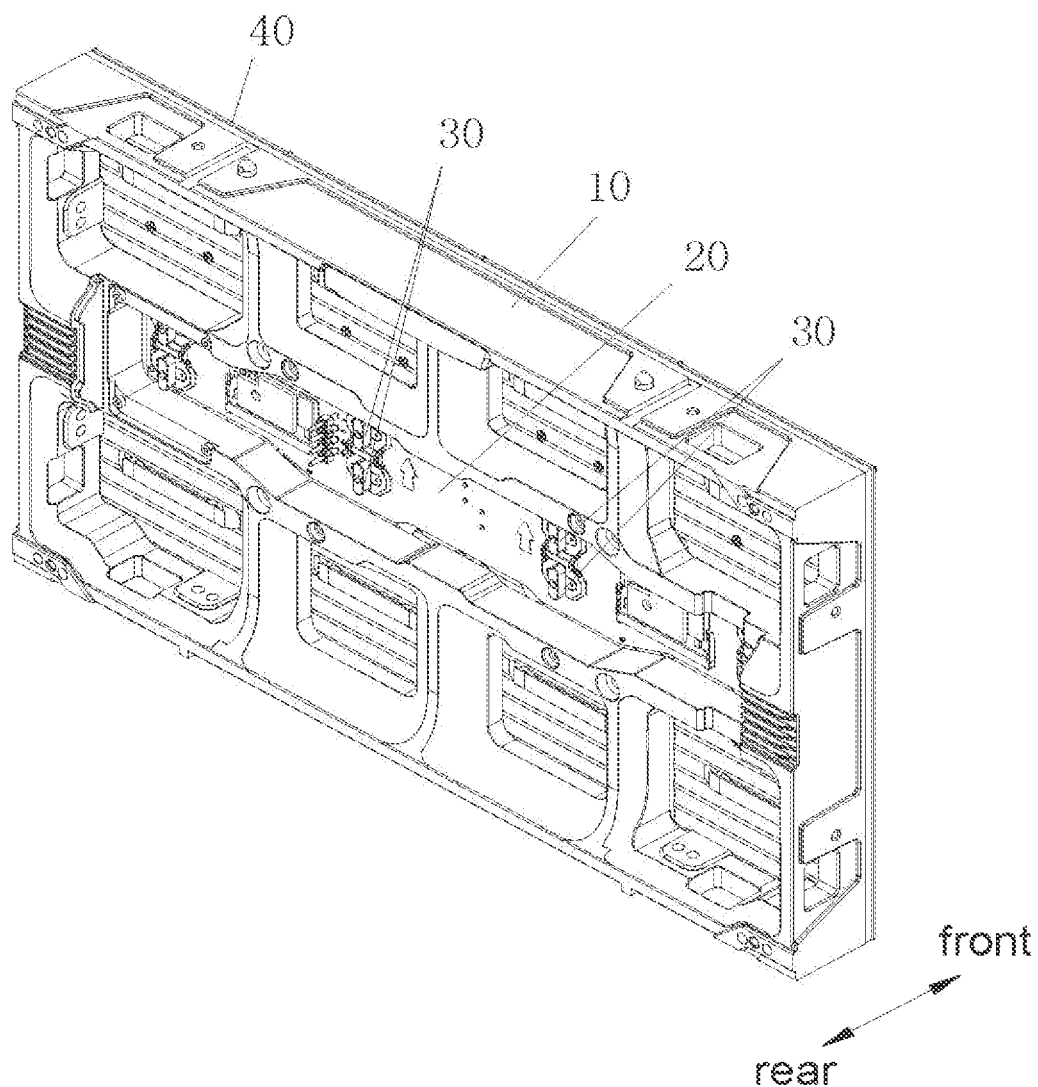
FIG. 5 shows a stereo structure diagram when the first lock tongue of the LED display device of FIG. 1 is located at a first unlocking position.
Figure 6:
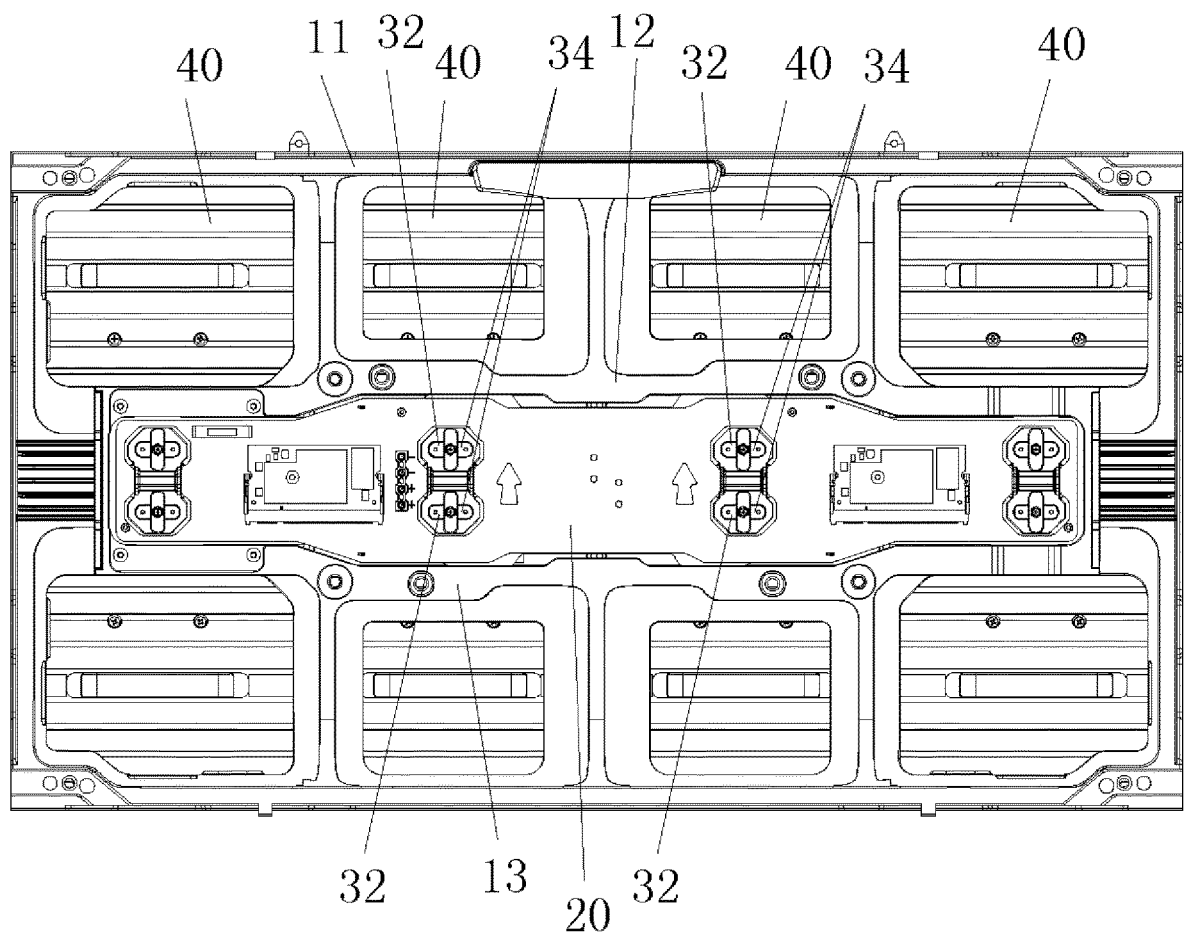
FIG. 6 shows a rear view when the first lock tongue of the LED display device of FIG. 5 is located at the first unlocking position.
Figure 7:
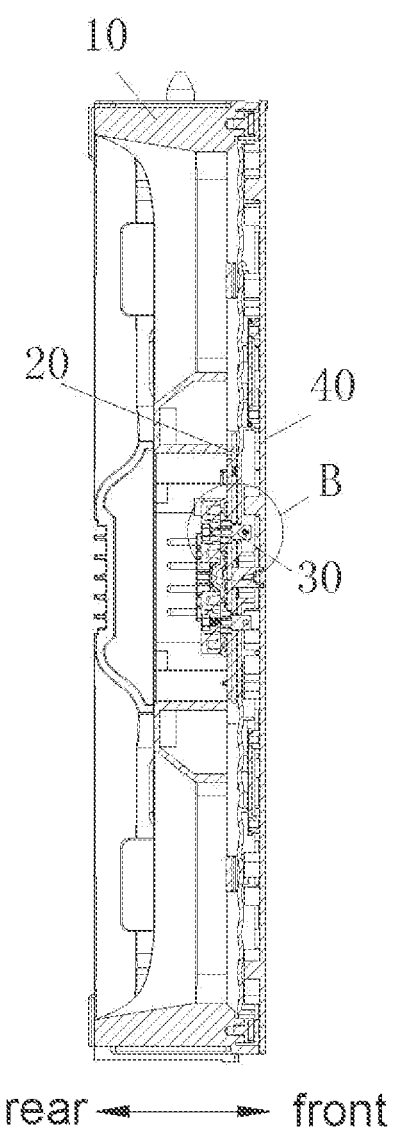
FIG. 7 shows a section view when the first lock tongue of the LED display device of FIG. 5 is located at the first unlocking position.
Figure 8:
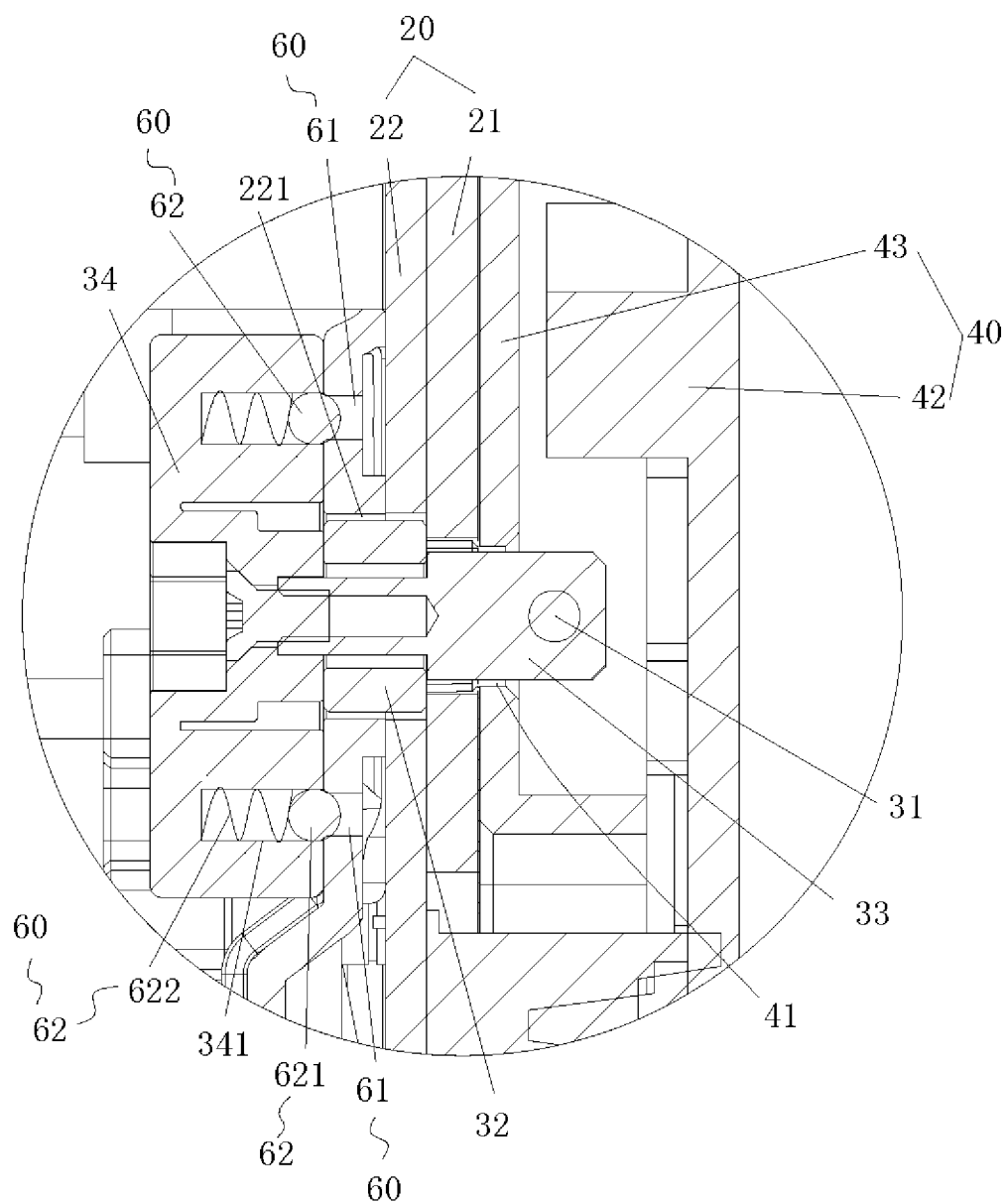
FIG. 8 shows an enlarged view of part B when the first lock tongue of the LED display device of FIG. 7 is located at the first unlocking position.

Herein, the above drawings include the following reference numbers:

10. Rectangle framework; 11. Frame; 111. First vertical side section; 112. First transverse side section; 113. Second vertical side section; 114. Second transverse side section; 12. First transverse beam; 121. First transverse section; 122. Second transverse section; 123. Third transverse section; 13. Second transverse beam; 14. First longitudinal beam; 15. Second longitudinal beam; 20. Adapter plate assembly; 21. Fixed plate; 212. Fixed plate body; 2121. Middle section; 2122. End section; 2123. Avoiding hole; 214. Convex edge; 211. Via hole; 22. Adapter plate; 221. Second strip-shaped lock hole; 222. Adapter plate body; 223. Gasket housing; 2231. Mounting portion; 2232. Convex portion; 30. Lock; 31. First lock tongue; 32. Lock seat; 33. Rotary shaft; 34. Second lock tongue; 341. Limiting hole; 40. Display module; 41. First strip-shaped lock hole; 42. Lamp panel; 43. Rear plate; 50. Connector; 51. First magnetic attraction part; 52. Second magnetic attraction part; 53. Female connector; 54. Male connector; 60. Positioning structure; 61. Positioning hole; 62. Positioning piece; 621. Positioning bead; 622. Elastic piece; 71. First fastener; 72. Second fastener.

DETAILED DESCRIPTION OF THE EMBODIMENTS

The technical solutions in the embodiments of the disclosure will be clearly and completely described below in combination with the drawings in the embodiments of the disclosure. It is apparent that the described embodiments are not all embodiments but part of embodiments of the disclosure. In fact, the description of at least one exemplary embodiment below is merely illustrative, and will not be taken as any limitation to the disclosure and its application or use. All other embodiments obtained by those of ordinary skill in the art on the basis of the embodiments in the disclosure without creative work shall fall within the scope of protection of the disclosure.

It should be noted that terms used herein are merely intended to describe specific embodiments rather than limit exemplary embodiments according to the disclosure. Unless otherwise pointed out explicitly, a singular form used herein is also intended to include a plural form. In addition, it should also be understood that the term "include" and/or "comprise" used in the description indicates that there are features, steps, operations, devices, assemblies and/or combinations thereof.

Unless otherwise specified, relative arrangements of parts and steps, digital expressions and values elaborated in these embodiments will not limit the scope of the disclosure. Meanwhile, it should be understood, to facilitate the description, that the sizes of all parts shown in the drawings are not drawn according to an actual proportionate relationship. The technologies, the methods and the equipment known by those of ordinary skill in the art may not be elaborated. However, where appropriate, the technologies, the methods and the equipment should be deemed to be part of the authorized specification. In all examples shown and discussed here, any specific values should be merely explained to be exemplary rather than taken as a limitation. Therefore, other examples of the exemplary embodiments may have different values. It should be noted that the similar reference numbers and letters indicate the similar items in the drawings below, so there is no need to further discuss it in subsequent drawings once an item is defined in one drawing.

As shown in FIG. 1-FIG. 11, an LED display device of the embodiment includes: a rectangle framework 10, an adapter plate assembly 20 and a display module 40. The rectangle framework 10 includes a frame 11, a first transverse beam 12 and a second transverse beam 13 that are arranged inside the frame 11 at intervals. A strip-like gap is enclosed by the first transverse beam 12, the second transverse beam 13 and a part of the frame 11. The adapter plate assembly 20 includes a fixed plate 21 mounted at the strip-like gap and an adapter plate 22 detachably arranged on a rear side of the fixed plate 21, and the fixed plate 21 is provided with a lock 30. The display module 40 is mounted on a front side of the rectangle framework 10 through a magnetic attraction structure. A rear side of the display module 40 is provided with a first strip-shaped lock hole 41. In the embodiment, the lock 30 includes a rotary shaft 33 rotatably arranged on the fixed plate 21 and a first lock tongue 31 arranged on the rotary shaft 33. The first lock tongue 31 is able to go through the first strip-shaped lock hole 41 and has a first unlocking position corresponding to the first strip-shaped lock hole 41 and a first locking position that is staggered with the first strip-shaped lock hole 41, and the adapter plate 22 fits the display module 40 through a connector 50 in a plugging-in manner.

With an adoption of the technical solution of the embodiment, the adapter plate assembly 20 includes the fixed plate 21 mounted at the strip-like gap and the adapter plate 22 detachably arranged on the rear side of the fixed plate 21. In this way, the strip-like gap accommodates the adapter plate assembly 20, and accordingly a thickness of the LED display device is reduced, and the LED display device is lighter and thinner. The fixed plate 21 is provided with the lock 30. The display module 40 is mounted on the front side of the rectangle framework 10 through the magnetic attraction structure, and the rear side of the display module 40 is provided with the first strip-shaped lock hole 41. In the embodiment, the lock 30 includes the rotary shaft 33 rotatably arranged on the fixed plate 21 and the first lock tongue 31 arranged on the rotary shaft 33. The first lock tongue 31 is able to go through the first strip-shaped lock hole 41 and has the first unlocking position corresponding to the first strip-shaped lock hole 41 and the first locking position that is staggered with the first strip-shaped lock hole 41, and the adapter plate 22 fits the display module 40 through the connector 50 in the plugging-in manner. During maintenance of the adapter plate from a rear side, the adapter plate is maintained after being dismounted from the rear side of the fixed plate 21. After the maintenance of the adapter plate from the rear side, the adapter plate 22 is mounted on the fixed plate 21 again and needs to fit the display module 40 on the rectangle framework 10 through the connector 50 in the plugging-in manner. Before the adapter plate 22 fits the display module 40 in the plugging-in manner through the connector 50, the first lock tongue 31 is switched to the first locking position from the first unlocking position, the first lock tongue 31 fits the first strip-shaped lock hole 41 in a staggered manner, and the first lock tongue 31 locks the first strip-shaped lock hole 41, as to lock the display module 40 on the rectangle framework 10. During the adapter plate 22 fits the display module 40 through the connector 50 in the plugging-in manner, pushing force applied onto the adapter plate 22 is transmitted onto the display module 40 through the connector 50. When the pushing force is greater than a magnetic attraction force of the magnetic attraction structure, the display module 40 is firmly locked on the rectangle framework 10 by the lock 30, and would not be pushed far away from the rectangle framework 10 by the pushing force. In this way, the display module is prevented from falling, a security protection is achieved, and accordingly the adapter plate 22 is facilitated to be mounted on the rear side of the fixed plate 21. Therefore, the technical solution of the disclosure effectively solves a problem that a display module in a related art falls due to separation from a box body.

It is to be noted that the first strip-shaped lock hole 41 corresponds to the first lock tongue 31, meaning that a projection of an outline of the first lock tongue 31 on a front side of the display module 40 coincides with the first strip-shaped lock hole 41, or the projection of the outline of the first lock tongue 31 on the front side of the display module 40 is located in the first strip-shaped lock hole 41.

As shown in FIG. 3, FIG. 4 and FIG. 7-FIG. 16, the adapter plate 22 of the embodiment is provided with a second strip-shaped lock hole 221. The lock 30 further includes a second lock tongue 34 arranged on the rotary shaft 33, and the second lock tongue 34 is able to go through the second strip-shaped lock hole 221 and has a second unlocking position corresponding to the second strip-shaped lock hole 221 and a second locking position that is staggered with the second strip-shaped lock hole 221. Wherein, the second lock tongue 34 is located at the second unlocking position when the first lock tongue 31 is located at the first locking position, and the second lock tongue 34 is located at the second locking position when the first lock tongue 31 is located at the first unlocking position. In this way, the second lock tongue 34 is located at the second unlocking position when the first lock tongue 31 is located at the first locking position, and the display module 40 is firmly locked on the rectangle framework 10 by the lock 30. Meanwhile, because the second lock tongue 34 is located at the second unlocking position, the second lock tongue 34 is able to go through the second strip-shaped lock hole 221 on the adapter plate 22. At this moment, by rotating the rotary shaft 33, the first lock tongue 31 is switched to the first unlocking position from the first locking position and the second lock tongue 34 is switched to the second locking position from the second unlocking position, and the adapter plate 22 is fixed on the fixed plate 21 by the lock 30. At this moment, because the first lock tongue 31 is located at the first unlocking position, the display module 40 is able to be taken down from the rectangle framework 10 for maintenance.

In addition, the inventor finds that, in a the related art, a set of dismounting/mounting tool (such as a sleeve) is needed to dismount/mount a nut during maintenance of the adapter plate from a front side, and another set of dismounting/mounting tool (such as a wrench) is needed to dismount/mount a screw during maintenance of the adapter plate from the rear side. In this way, two sets of dismounting/mounting tools are used to realize maintenance for the adapter plate from the front side and from the rear side, and accordingly operations are complicated.

To solve the above problem, as shown in FIG. 3, FIG. 4 and FIG. 7-FIG. 16, the adapter plate 22 of the embodiment is provided with the second strip-shaped lock hole 221. The lock 30 further includes the second lock tongue 34 arranged on the rotary shaft 33, and the second lock tongue 34 is able to go through the second strip-shaped lock hole 221 and has the second unlocking position corresponding to the second strip-shaped lock hole 221 and the second locking position that is staggered with the second strip-shaped lock hole 221. Wherein, the second lock tongue 34 is located at the second unlocking position when the first lock tongue 31 is located at the first locking position, and the second lock tongue 34 is located at the second locking position when the first lock tongue 31 is located at the first unlocking position. In this way, during the maintenance of the adapter plate 22 from the front side, the second lock tongue 34 is located at the second locking position when the first lock tongue 31 is located at the first unlocking position, and the display module is able to be dismounted from the rectangle framework 10. Because the adapter plate 22 is fixed on the fixed plate 21 by the lock 30, the adapter plate 22 is able to be dismounted/mounted together with the fixed plate 21 when the fixed plate 21 is dismounted/mounted, and accordingly the maintenance of the adapter plate 22 from the front side is realized. During the maintenance of the adapter plate 22 from the rear side, the second lock tongue 34 is located at the second unlocking position when the first lock tongue 31 is located at the first locking position by rotating the rotary shaft 33, and the second strip-shaped lock hole 22 on the adapter plate 22 is able to depart from the fixed plate 21, thereby facilitating the adapter plate 22 to be dismounted from the rectangle framework 10. In this way, the maintenance of the adapter plate 22 from the rear side is realized. Accordingly, the maintenance of the adapter plate 22 from the rear side is realized without using another dismounting/mounting tool in the related art, and quantity of the dismounting/mounting tools to be used is reduced. In this way, during the maintenance of the adapter plate 22 from the front side and from the rear side, there is no need to use two sets of dismounting/mounting tools in the related art, and the operations become simple.

As shown in FIG. 4, FIG. 8 and FIG. 12-FIG. 18, in order to ensure that the first lock tongue 31 and the second lock tongue 34 both realize corresponding functions, during the second lock tongue 34 is located at the second unlocking position when the first lock tongue 31 is located at the first locking position or during the second lock tongue 34 is located at the second locking position when the first lock tongue 31 is located at the first unlocking position, the first lock tongue 31 is arranged on a front end of the rotary shaft 33, and the second lock tongue 34 is arranged on a rear end of the rotary shaft 33. Moreover, because the first strip-shaped lock hole 41 and the second strip-shaped lock hole 221 are arranged correspondingly, the first lock tongue 34 and the first lock tongue 31 are arranged perpendicularly. The second lock tongue 34 is stably and reliably located at the second unlocking position when the first lock tongue 31 is located at the first locking position, and the second lock tongue 34 is stably and reliably located at the second locking position when the first lock tongue 31 is located at the first unlocking position. On the contrary, the first lock tongue 31 is stably and reliably located at the first locking position when the second lock tongue 34 is located at the second unlocking position, and the first lock tongue 31 is stably and reliably located at the first unlocking position when the second lock tongue 34 is located at the second locking position.

As shown in FIG. 12-FIG. 20, in order to make the rotary shaft 33 reliably mounted on the fixed plate 21, the lock 30 further includes a lock seat 32 arranged on the fixed plate 21, and the rotary shaft 33 is rotatably arranged on the lock seat 32. The first lock tongue 31 is of column-shaped, and the second lock tongue 34 is of block-shaped. The column-shaped first lock tongue 31 is conveniently machined and easily molded. When the second lock tongue 34 is located at the second locking position, the block-shaped second lock tongue 34 has an effect of reliably locking. Meanwhile, because the second lock tongue 34 is of block-shaped, a nice operating position is formed and the operations is facilitated, as to switch the second lock tongue 34 between the second unlocking position and the second locking position.

As shown in FIG. 10-FIG. 18, a part of the lock seat 32 is strip-shaped, and the strip-shaped lock seat 32 is located in the second strip-shaped lock hole 221. In this way, the second lock tongue 34 is raised by the strip-shaped lock seat 32, to prevent the second lock tongue 34 from interference with a structure (such as a component) on the adapter plate 22 when switching between the second locking position and the second unlocking position.

As shown in FIG. 4, FIG. 8 and FIG. 10-FIG. 18, in order to make the second lock tongue 34 rapidly switched to the second unlocking position from the second locking position, or to the second locking position from the second unlocking position, the lock 30 further includes a positioning structure 60 arranged between the adapter plate 22 and the second lock tongue 34.

As shown in FIG. 4, FIG. 8 and FIG. 10-FIG. 18, the positioning structure 60 includes a positioning hole 61 and a positioning piece 62 fitting the positioning hole 61 in a positioning manner. The positioning hole 61 is arranged on the adapter plate 22, and the positioning piece 62 is arranged on the second lock tongue 34. The positioning hole 61 fits the positioning piece 62 in the positioning manner, in this way the positioning structure 60 is simple in structure.

Of course, in embodiments not shown in the drawings, the positioning piece is arranged on the adapter plate, and the positioning hole is arranged on the second lock tongue.

As shown in FIG. 4, FIG. 8 and FIG. 10-FIG. 18, the positioning hole 61 is arranged on the adapter plate 22, and the positioning piece 62 is arranged on the second lock tongue 34. The positioning piece 62 includes a positioning bead 621 and an elastic piece 622. The second lock tongue 34 is provided with a limiting hole 341, the elastic piece 622 is located in the limiting hole 341, and the positioning bead 621 is limited in the limiting hole 341. A part of the positioning bead 621 is able to be located in the positioning hole 61, in this way the second lock tongue 34 is kept at the second locking position. Elastic force far away from a direction of the second lock tongue 34 is applied to the positioning bead 621 by the elastic piece 622, in this way the positioning bead 621 is subjected to the elastic force all the time. In order to make the positioning bead 621 stably limited in the limiting hole 341, an equatorial plane of the positioning bead 621 is located in the limiting hole 341. The above fit of the positioning bead 621 and the elastic piece 622 makes the positioning piece 62 have a function of scaling. When the positioning bead 621 is subjected to a pressing force to contract the positioning piece 62, the second lock tongue 34 is able to move between the second locking position and the second unlocking position. When the positioning bead 621 is subjected to the elastic force only and accordingly the positioning piece 62 extends outward, the second lock tongue 34 is able to be stably kept at the second locking position or the second unlocking position. The above elastic piece is a spring.

As shown in FIG. 4, FIG. 8 and FIG. 10-FIG. 18, the positioning hole 61 is arranged on the adapter plate 22, and the positioning piece 62 is arranged on the second lock tongue 34. The adapter plate 22 includes an adapter plate body 222 and a gasket housing 223 arranged on a rear side of the adapter plate body 222, the second strip-shaped lock hole 221 is arranged on the gasket housing 223, the adapter plate body 222 is provided with an avoiding hole corresponding to the second strip-shaped lock hole 221, and the positioning hole 61 is arranged on the gasket housing 223. During the adapter plate 22 is dismounted/mounted from/on the fixed plate 21, the second lock tongue 34 goes through the second strip-shaped lock hole 221, as to prevent the adapter plate 22 from being damaged due to collision of the second lock tongue 34 and the adapter plate 22. The above second strip-shaped lock hole 221 is arranged on the gasket housing 223, and the gasket housing 223 isolates the second lock tongue 34 from the adapter plate body 222. In this way, the second lock tongue 34 is prevented from direct contact with the adapter plate body 222, the second lock tongue 34 is prevented from collision with the adapter plate body 222, and the adapter plate body 222 is protected. The gasket housing 223 is prepared from plastic.

As shown in FIG. 4, FIG. 8 and FIG. 10-FIG. 18, in order to mount the adapter plate 22 on the fixed plate 21 reliably and rapidly, there are a plurality of gasket housings 223, a plurality of locks 30 and a plurality of positioning structures 60. Quantity of the locks 30 may be an even multiple of that of the gasket housings 223, quantity of the positioning structures 60 may be an even multiple of that of the locks 30. Each of the gasket housings 223 includes two mounting portions 2231 and a convex portion 2232 arranged between the two mounting portions 2231, second lock tongues 34 of two locks 30 are arranged in one-to-one correspondence with the two mounting portions 2231, one of the positioning hole 61 and the positioning piece 62 of each positioning structure 60 is arranged on one mounting portion 2231, and another of the positioning hole 61 and the positioning piece 62 of the each positioning structure 60 is arranged on the second lock tongue 34.

As shown in FIG. 17-FIG. 21, in order to facilitate connection of the fixed plate 21 onto the first transverse beam 12 and the second transverse beam 13, the fixed plate 21 includes a fixed plate body 212 and a plurality of convex edges 214 arranged on an edge of the fixed plate body 212 at intervals. A part of the convex edges 214 are detachably connected onto the first transverse beam 12 through first fasteners 71, and a rest of the convex edges 214 are detachably connected onto the second transverse beam 13 through second fasteners 72. The first fastener 71 and the second fastener 72 are screws.

As shown in FIG. 17-FIG. 22, in order to shield the strip-like gap with the fixed plate 21 and facilitate mounting, a width of the fixed plate body 212 is greater than that of the strip-like gap. The fixed plate body 212 includes a middle section 2121 and two end sections 2122 arranged on two ends of the middle section 2121, and a width of the end section 2122 is smaller than that of the middle section 2121. In presence of the above sizes, a shape of the fixed plate body 212 fits a shape of the strip-like gap and a shape of the adapter plate 22, thereby facilitating mounting and saving a cost.

As shown in FIG. 10, and FIG. 17-FIG. 22, the adapter plate 22 is mounted on the fixed plate 21. In order to avoid the fixed plate 21 from interference with components on the adapter plate 22, the fixed plate body 212 is provided with a plurality of avoiding holes 2123 at intervals. The plurality of avoiding holes 2123 avoid the components on the adapter plate 22, in this way the adapter plate 22 is flatly mounted on the fixed plate 21.

As shown in FIG. 3, FIG. 4, and FIG. 7-FIG. 9, the display module 40 includes a lamp panel 42 and a rear plate 43 arranged on a rear side of the lamp panel 42. In order to facilitate machining of the first strip-shaped lock hole 41 on the display module 40, the first strip-shaped lock hole 41 is arranged on the rear plate 43. The fixed plate 21 is provided with via hole 211 of avoiding the connector 50. The connector 50 includes a female connector 53 arranged on the lamp panel 42 and a male connector 54 arranged on the adapter plate 22. In this way, during the female male connector 53 fits the male connector 54 in a plugging-in manner, the fixed plate 21 is prevented from interference with the connector 50 due to arrangement of the via hole 211.

As shown in FIG. 1, FIG. 2, FIG. 5, FIG. 6, and FIG. 21-FIG. 22, each of the first transverse beam 12 and the second transverse beam 13 includes a first transverse section 121, a second transverse section 122 and a third transverse section 123 that are connected in sequence. A distance between the second transverse section 122 of the first transverse beam 12 and the second transverse section 122 of the section transverse beam 13 is greater than a distance between the first transverse section 121 of the first transverse beam 12 and the first transverse section 121 of the second transverse beam 13, and the distance between the second transverse section 122 of the first transverse beam 12 and the second transverse section 122 of the second transverse beam 13 is greater than a distance between the third transverse section 123 of the first transverse beam 12 and the third transverse section 123 of the second transverse beam 13. In this way, in presence of the above sizes, a middle part of the strip-like gap is wide and two ends are narrow. In this way, the shape of the strip-like gap fits the shape of the adapter plate 22, the adapter plate 22 is reasonably accommodated, it is conducive to saving an inner space of the LED display device and reducing the thickness of the LED display device, and accordingly the LED display device is lighter and thinner.

As shown in FIG. 1, FIG. 2, FIG. 5, FIG. 6, and FIG. 21-FIG. 22, the frame 11 includes a first vertical side section 111, a first transverse side section 112, a second vertical side section 113 and a second transverse side section 114 that are connected in sequence. The first transverse beam 12 and the second transverse beam 13 are arranged at intervals in a vertical direction. Two ends of the first transverse beam 12 are connected onto the first vertical side section 111 and the second vertical side section 113 respectively, two ends of the second transverse beam 13 are connected with the first vertical side section 111 and the second vertical side section 113 respectively. The strip-like gap is enclosed by the first transverse beam 12, the second transverse beam 13, a part of the first vertical side section 111 and a part of the second vertical side section 113. The rectangle framework 10 further includes a plurality of first longitudinal beams 14 located in the frame 11, the plurality of first longitudinal beams 14 are arranged at intervals along a length direction of the rectangle framework 10, and two ends of each first longitudinal beam 14 are connected onto the first transverse side section 112 and the first transverse beam 12 respectively. In this way, the rectangle framework 10 has an enough structural strength. A first rectangle hole is enclosed by the first longitudinal beam 14 that is nearest to the first vertical side section 111, a part of the first transverse beam 12, a part of the first vertical side section 111 and a part of the first transverse side section 112, a second rectangle hole is enclosed by the first longitudinal beam 14 that is nearest to the second vertical side section 113, a part of the first transverse beam 12, a part of the second vertical side section 113 and a part of the first transverse side section 112, and a third rectangle hole is enclosed by two adjacent first longitudinal beams 14, a part of the first transverse beam 12 and a part of the first transverse side section 112. The first rectangle hole has a same shape as that of the second rectangle hole. A minimal cross section area of the first rectangle hole is greater than a maximal cross section area of the third rectangle hole, and a diagonal distance of the first rectangle hole is greater than a width of the display module 40.

When the display module 40 needs to be taken down from the rectangle framework 10 for the maintenance from the front side, make the first lock tongue 31 locate at the first unlocking position, and the display module 40 only needs to be unplugged from the rectangle framework 10 with force, in this way the display module 40 overcomes the magnetic attraction force of the magnetic attraction structure. When the display module 40 needs to be taken down from the rectangle framework 40 for the maintenance from the rear side, make the first lock tongue 31 locate at the first unlocking position, and the display module 40 is pushed forward through the first rectangle hole or the second rectangle hole, in this way the display module 40 is separated from the rectangle framework 10. Then rotate the display module 40 so that the display module 40 is tilted. Because the diagonal distance of the first rectangle hole is greater than the width of the display module 40, the display module 40 is able to go through the first rectangle hole or the second rectangle hole, and is able to be taken down from the rear side of the rectangle framework 10.

It should be noted that the first rectangle hole meets conditions that two adjacent sides are vertical, and two opposite sides are parallel to each other, and an interior of the first rectangle hole can have structures such as a bulge, an included angle, a chamber and a transitional arc. A "cross section" in the "minimal cross section areas of the first rectangle hole" is perpendicular to an axis of the first rectangle hole. "The diagonal distance of the first rectangle hole is greater than the width of the display module 40" refers to that one of two diagonal distances of the first rectangle hole is greater than the width of the display module 40, or each of the two diagonal distances of the first rectangle hole is greater than the width of the display module 40.

The above third rectangle hole forms a space for operations of a hand, thereby facilitating dismounting/mounting of the display module from/in the first rectangle hole or the second rectangle hole.

As shown in FIG. 1, FIG. 2, FIG. 5, FIG. 6, and FIG. 21-FIG. 22, the rectangle framework 10 further includes a plurality of second longitudinal beams 15 located in the frame 11, the plurality of second longitudinal beams 15 are arranged at intervals along a length direction of the frame 11, and two ends of each second longitudinal beam 15 are connected with the second transverse side section 114 and the second transverse beam 13 respectively. In this way, the rectangle framework 10 has the enough structural strength. A fourth rectangle hole is enclosed by the second longitudinal beam 15 that is nearest to the first vertical side section 111, a part of the second transverse beam 13, a part of the first vertical side section 111 and a part of the second transverse side section 114, a fifth rectangle hole is enclosed by the second longitudinal beam 15 that is nearest to the second vertical side section 113, a part of the second transverse beam 13, a part of the second vertical side section 113 and a part of the second transverse side section 114, and a sixth rectangle hole is enclosed by two adjacent second longitudinal beams 15, a part of the second transverse beam 13 and a part of the second transverse side section 114. The fourth rectangle hole has a same shape as that of the fifth rectangle hole. A minimal cross section area of the fourth rectangle hole is greater than a maximal cross section area of the sixth rectangle hole, and a diagonal distance of the fourth rectangle hole is greater than the width of the display module 40.

In this embodiment, when the display module 40 needs to be taken down from the rectangle framework 40 for the maintenance from the rear side, as an alternative, the display module 40 is pushed forward through the fourth rectangle hole or the fifth rectangle hole, in this way the display module 40 is separated from the rectangle framework 10. Then rotate the display module 40 so that the display module 40 is tilted. Because the diagonal distance of the fourth rectangle hole is greater than the width of the display module 40, the display module 40 is able to go through the fourth rectangle hole or the fifth rectangle hole, and is able to be taken down from the rear side of the rectangle framework 10.

It should be noted that the fourth rectangle hole meets conditions that two adjacent sides are vertical, and two opposite sides are parallel to each other, and an interior of the fourth rectangle hole can structures such as a bulge, an included angle, a chamber and a transitional arc. A "cross section" in the "minimal cross section areas of the fourth rectangle hole" is perpendicular to an axis of the fourth rectangle hole. "The diagonal distance of the fourth rectangle hole is greater than the width of the display module 40" refers to that one of two diagonal distances of the fourth rectangle hole is greater than the width of the display module 40, or each of the two diagonal distances of the fourth rectangle hole is greater than the width of the display module 40.

The above sixth rectangle hole forms a space for operations of a hand, thereby facilitating dismounting/mounting of the display module from/in the fourth rectangle hole or the fifth rectangle hole.

Figure 9:
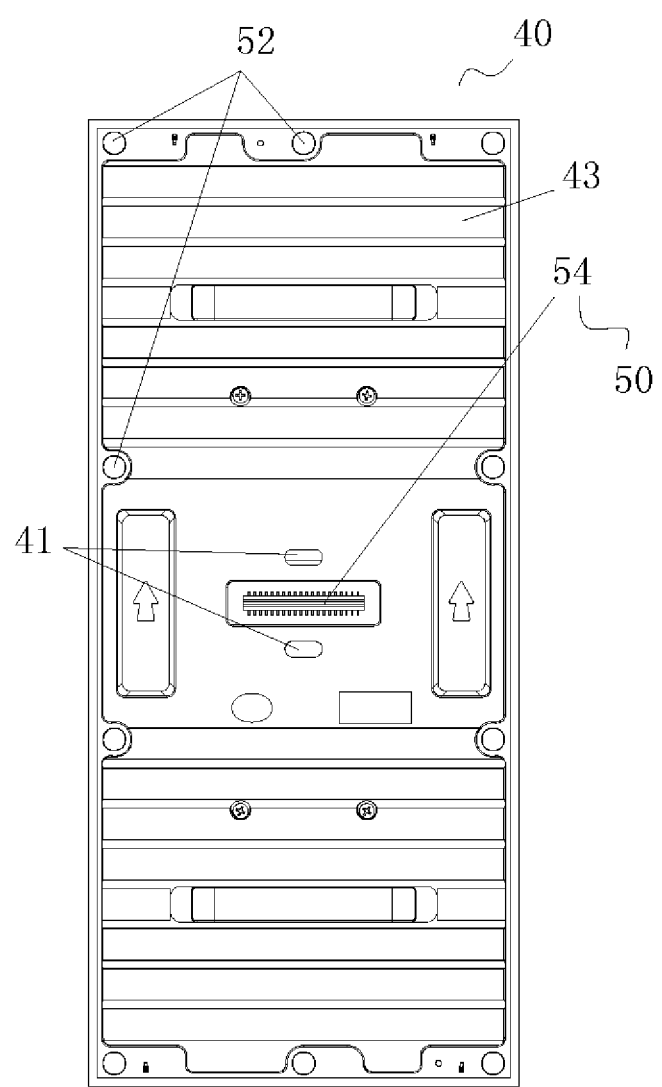
FIG. 9 shows a rear view of a display module of the LED display device of FIG. 1.
Figure 10:
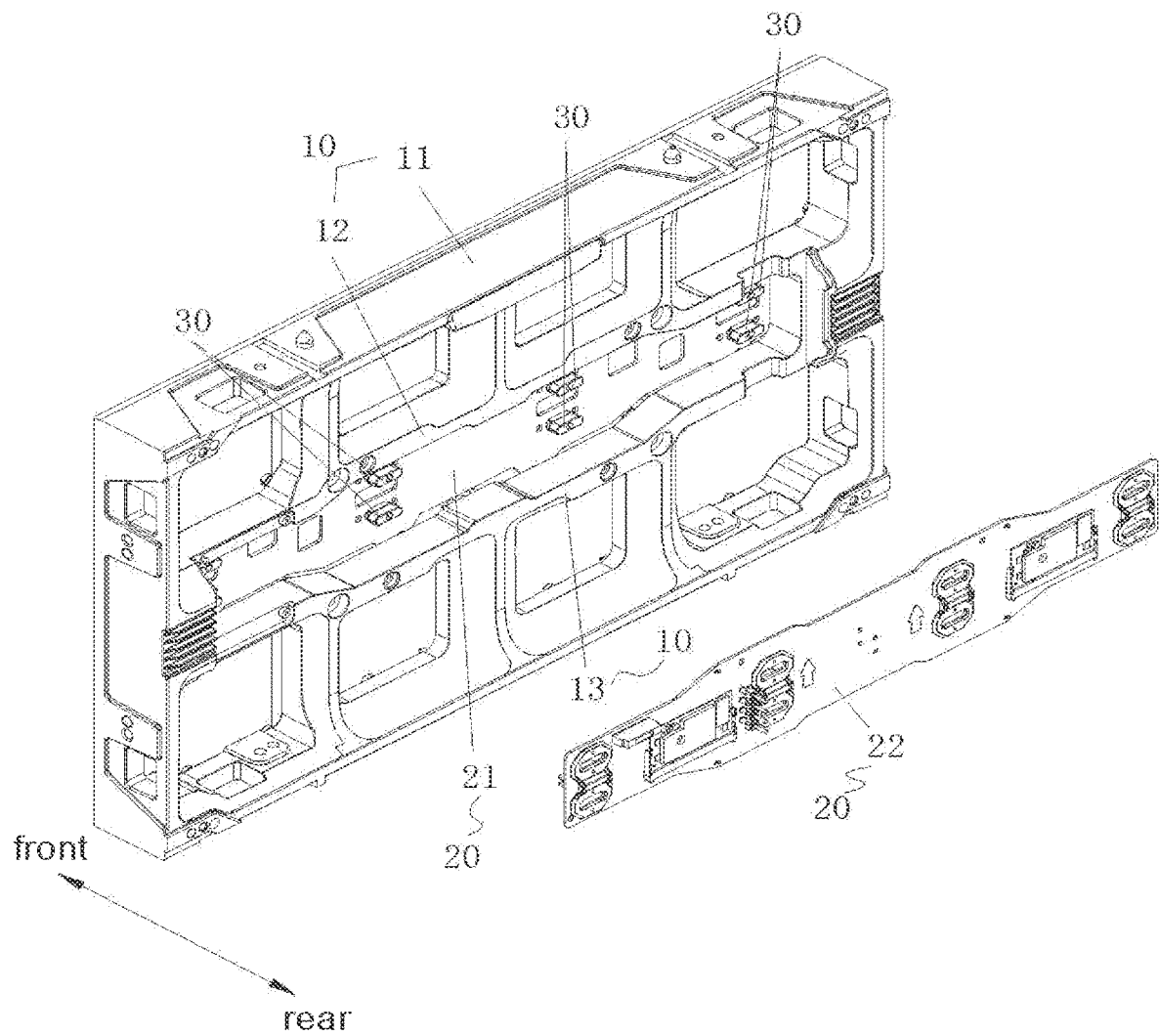
FIG. 10 shows an exploded view of part of structures when the first lock tongue of the LED display device of FIG. 1 is located at the first locking position.
Figure 11:
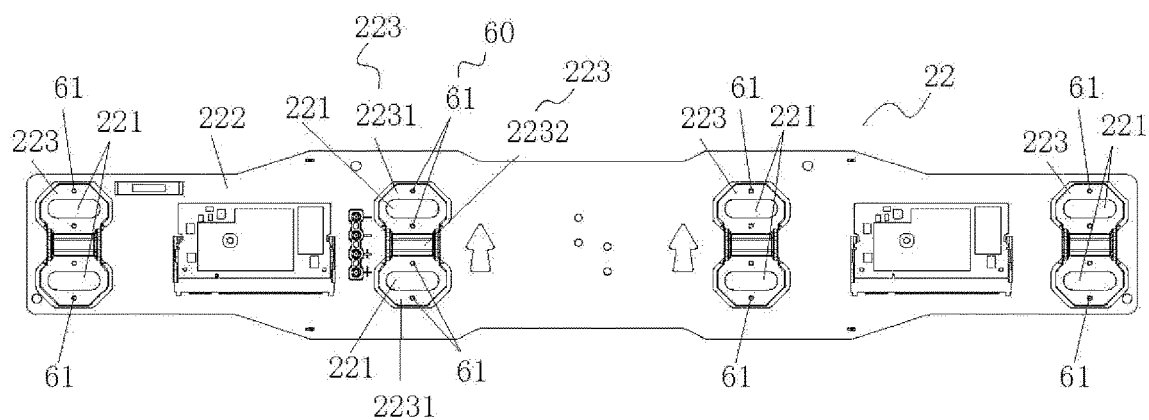
FIG. 11 shows a front view of an adapter plate of the LED display device of FIG. 1.
Figure 12:
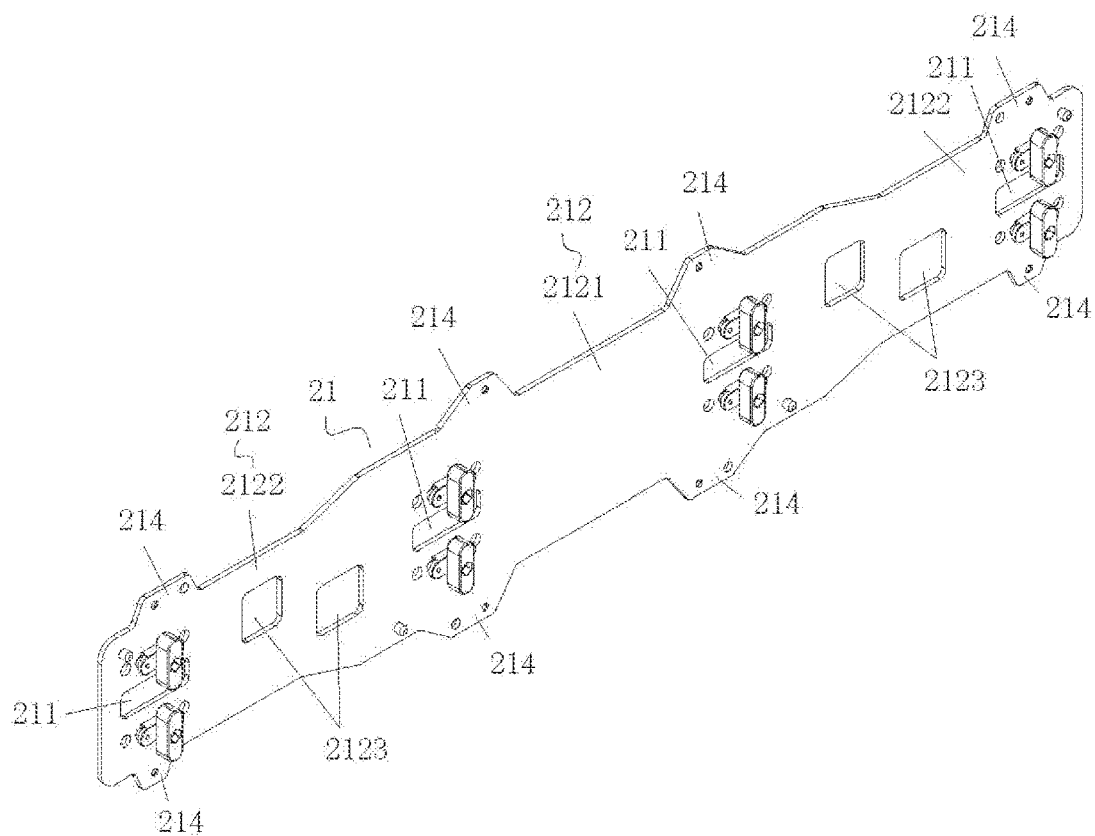
FIG. 12 shows a stereo structure diagram when the first lock tongue on a fixed plate of FIG. 1 is located at a first unlocking position.
Figure 13:
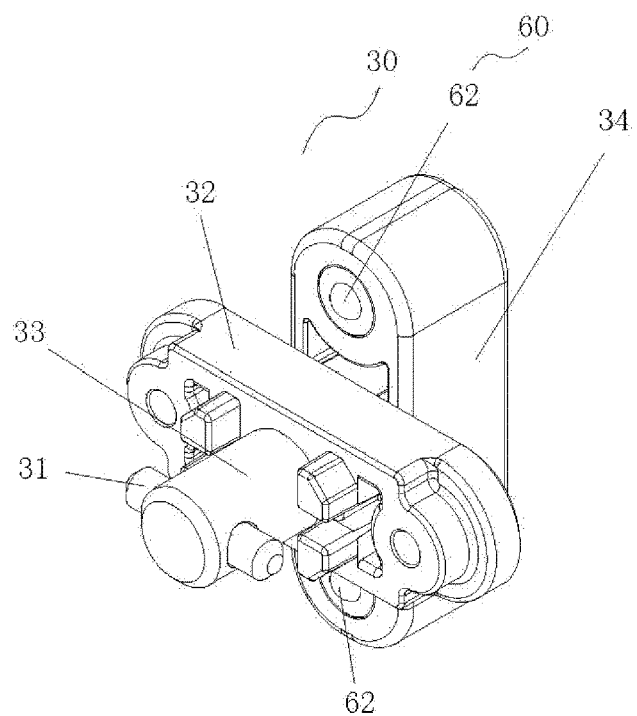
FIG. 13 shows a stereo structure diagram when the first lock tongue of a lock of FIG. 1 is located at a first unlocking position.
Figure 14:
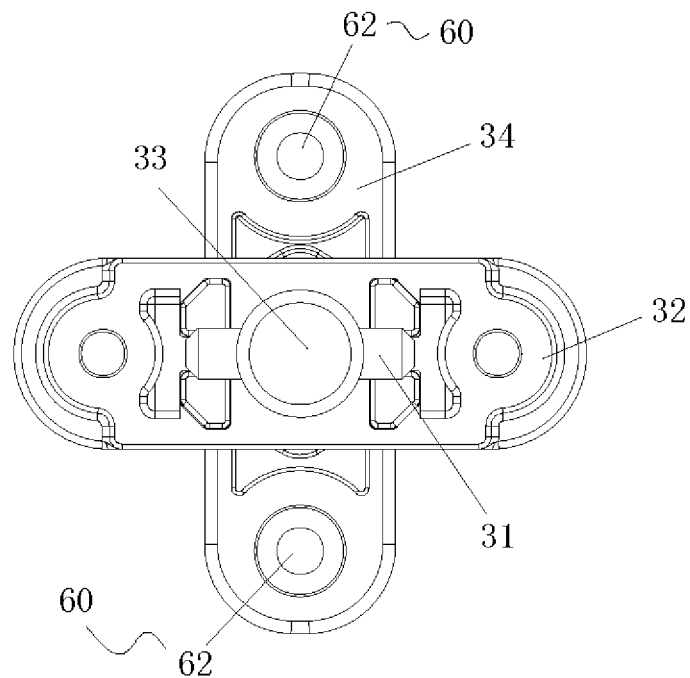
FIG. 14 shows a front view when the first lock tongue of the lock of FIG. 13 is located at the first unlocking position.
Figure 15:
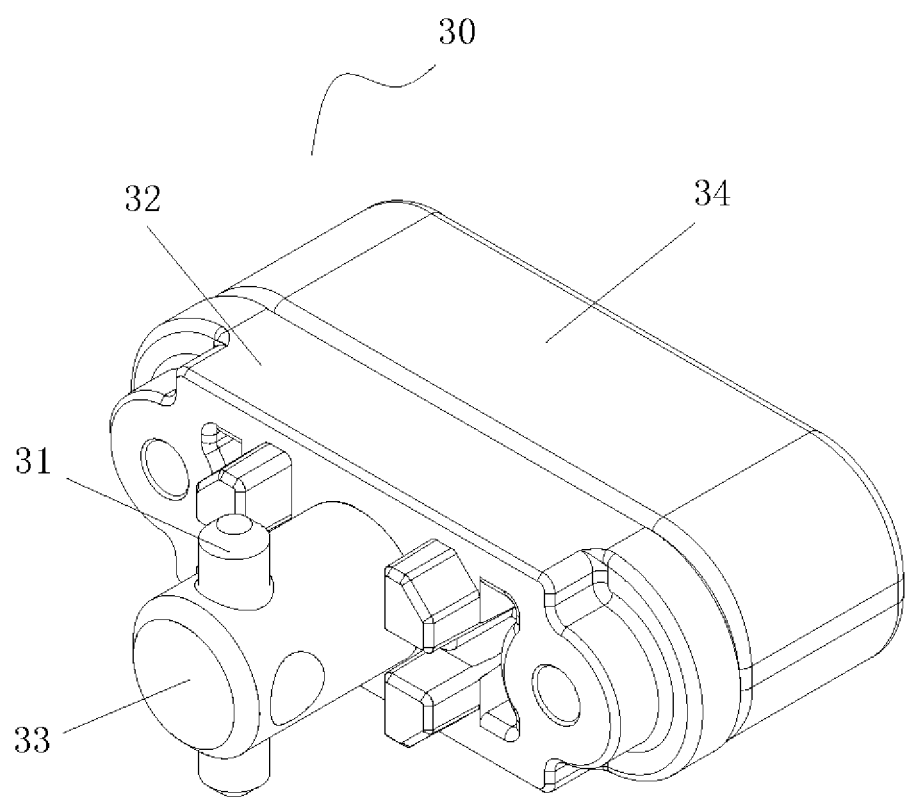
FIG. 15 shows a stereo structure diagram when the first lock tongue of a lock of FIG. 1 is located at the first locking position.
Figure 16:
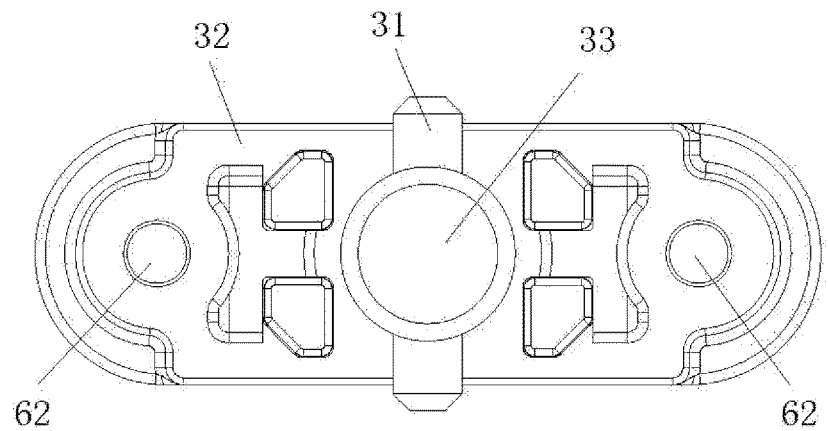
FIG. 16 shows a front view when the first lock tongue of the lock of FIG. 15 is located at the first locking position.
Figure 17:
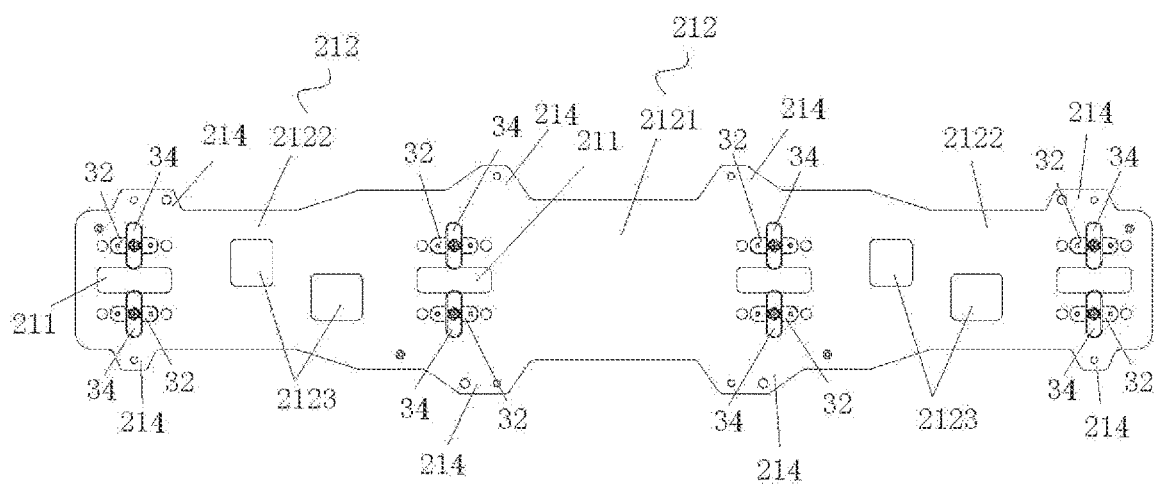
FIG. 17 shows a rear view when the first lock tongue on a fixed plate of FIG. 1 is located at a first unlocking position.
Figure 18:
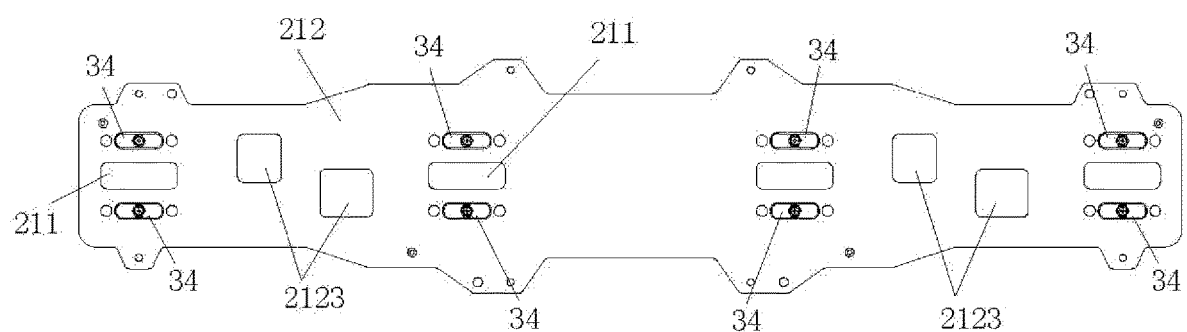
FIG. 18 shows a rear view when the first lock tongue on a fixed plate of FIG. 1 is located at the first locking position.
Figure 19:
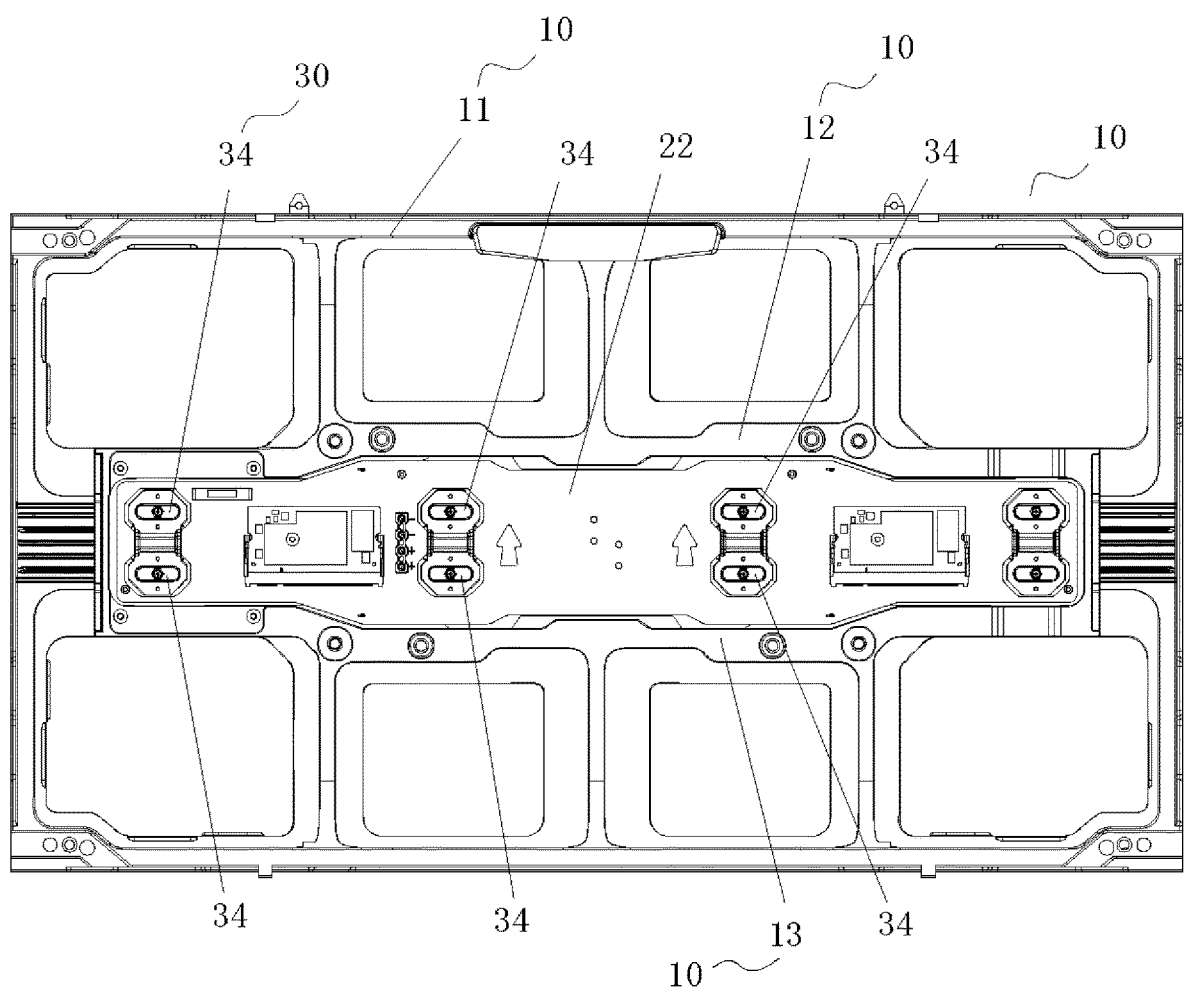
FIG. 19 shows a rear view when the first lock tongue is located at the first locking position after removal of a display module from the LED display device of FIG. 1.
Figure 20:
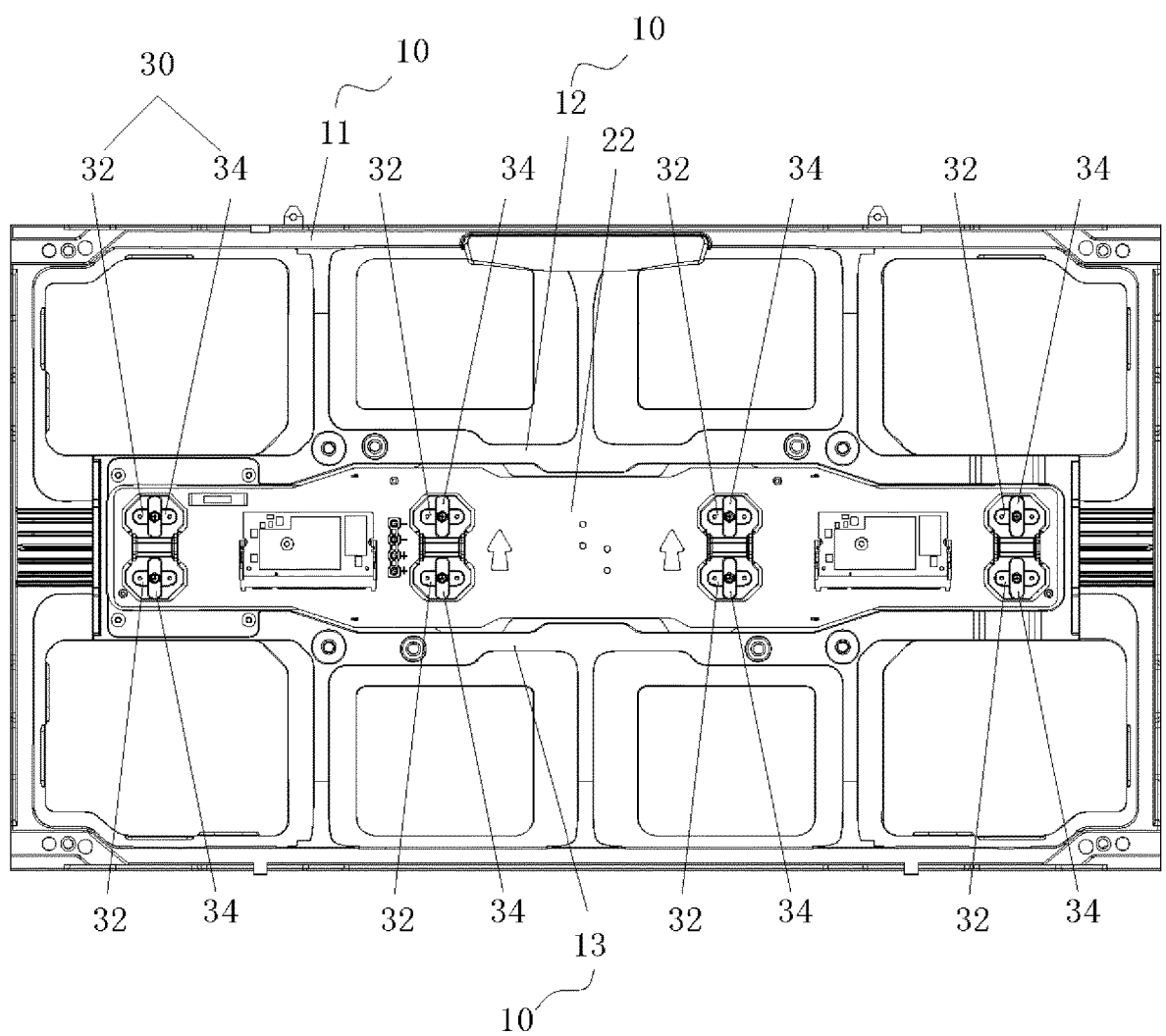
FIG. 20 shows a rear view when the first lock tongue is located at a first unlocking position after removal of a display module from the LED display device of FIG. 1.
Figure 21:
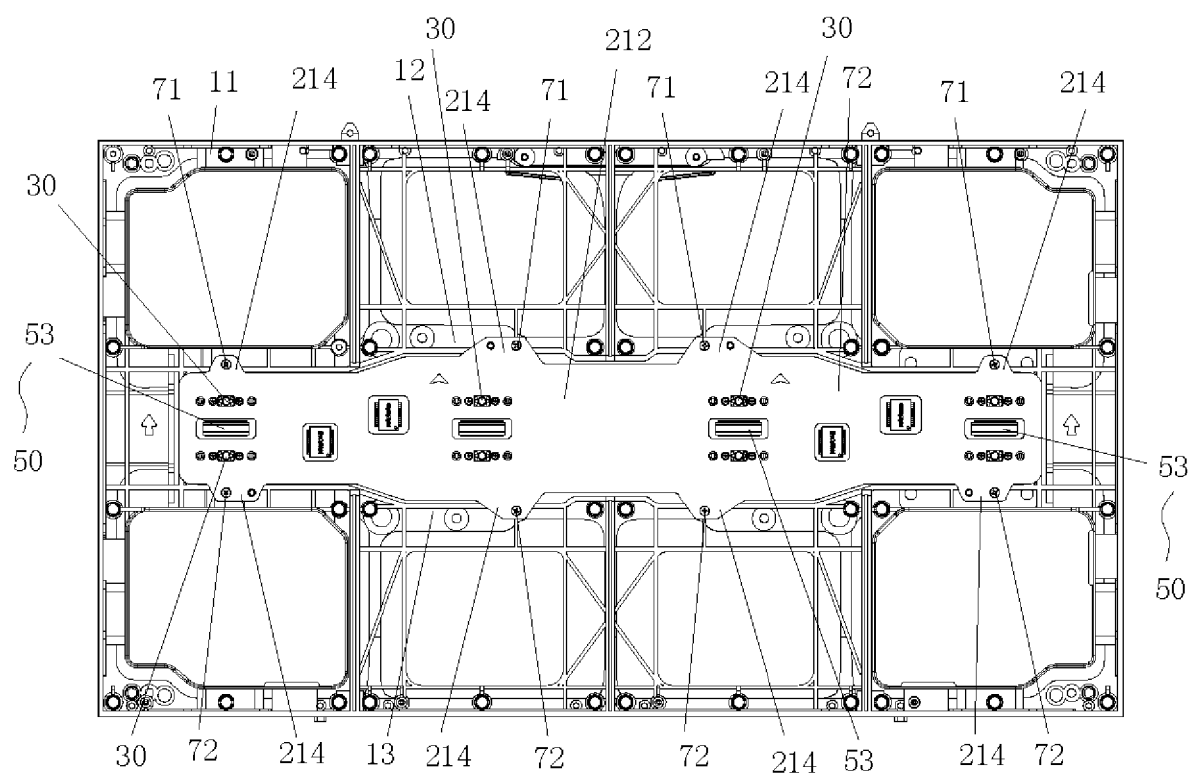
FIG. 21 shows a front view when the first lock tongue is located at the first unlocking position after removal of the display module from the LED display device of FIG. 20.
Figure 22:
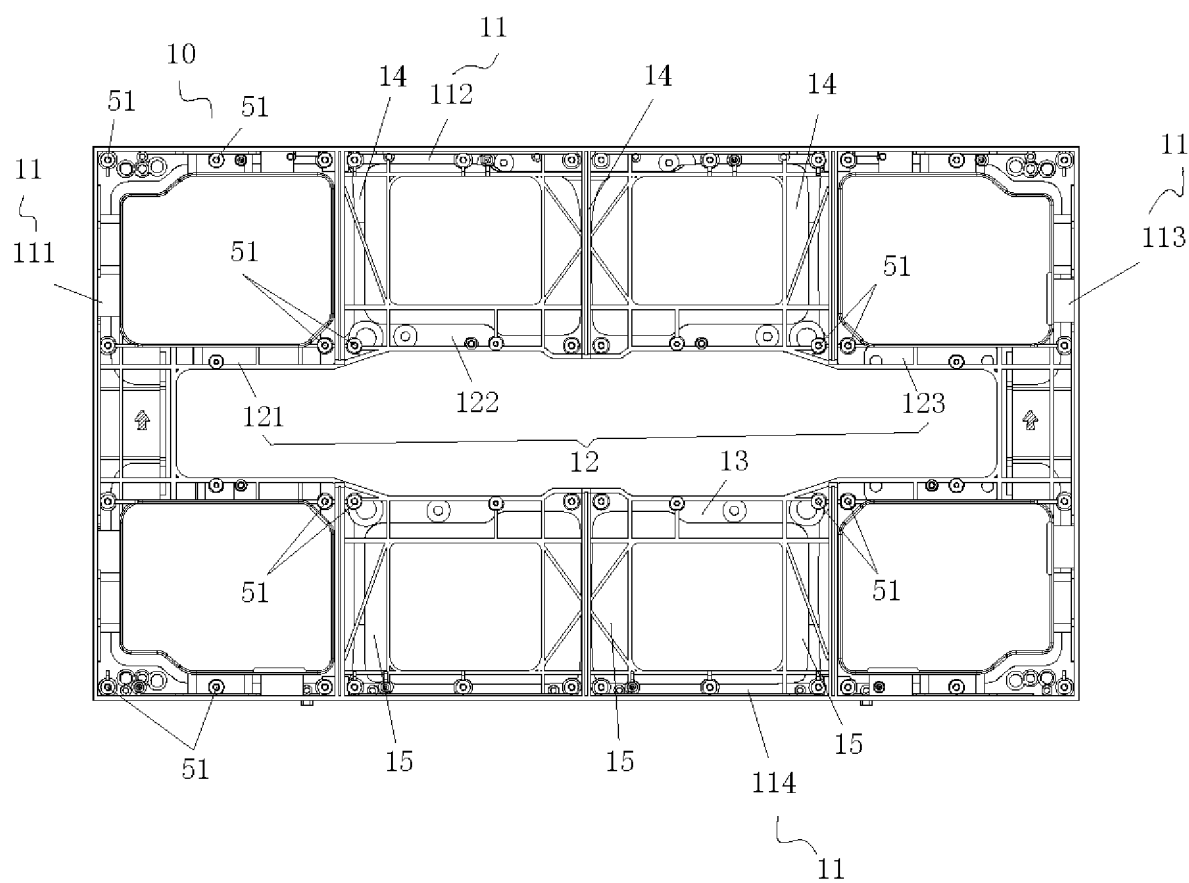
FIG. 22 shows a front view of a rectangle framework of FIG. 1.

As shown in FIG. 9, FIG. 21 and FIG. 22, in order to facilitate machining and manufacturing, there are a plurality of display modules 40 and a plurality of magnetic attraction structures. Each display module 40 is spliced on the front side of the rectangle framework 10 through the plurality of magnetic attraction structures. There are four display modules 40, and a quantity of the magnetic attraction structures is at least four times of a quantity of the display modules. Namely, each display module 40 is spliced on the front side of the rectangle framework 10 through at least four magnetic attraction structures.

Specifically, as shown in FIG. 9, in this embodiment, each display module 40 is spliced on the front side of the rectangle framework 10 through ten magnetic attraction structures.

Of course, the quantity of the display modules is not limited to four, but can also be one, two, three, five or more. The quantity of the magnetic attraction structures is determined according to the quantity of the display modules.

As shown in FIG. 9, FIG. 21 and FIG. 22, a front side of the frame 11, a front side of the first transverse beam 12 and a front side of the second transverse beam 13 are provided with a plurality of fixed seats, respectively. Each of the plurality of magnetic attraction structures include a first magnetic attraction part 51 arranged on one fixed seat and a second magnetic attraction part 52 arranged on the rear side of the display module 40. The first magnetic attraction part 51 fits the second magnetic attraction part 52 in a magnetic attraction manner. In this way, the each first magnetic attraction part 51 fits the corresponding second magnetic attraction part 52 in the magnetic attraction manner, thereby facilitating detachable mounting of the display module 14 on the front side of the rectangle framework 10. Front sides of the first magnetic attraction parts 51 of the plurality of magnetic attraction structures are coplanar, thereby forming a flat mounting plane. In this way, the display modules 40 are ensured to be mounted on the front side of the rectangle framework 10 with a high flatness.

In the description of the disclosure, it is to be understood that orientation or position relationships indicated by terms "front", "back", "upper", "lower", "left", "right", "transverse", "longitudinal", "vertical", "horizontal", "top", "bottom" and the like are orientation or position relationships shown in the drawings usually, are adopted not to indicate or imply that indicated devices or components must be in specific orientations or structured and operated in specific orientations but only to conveniently describe the disclosure and simplify descriptions and thus should not be understood as limits to the scope of protection of disclosure. The orientations "inner" and "outer" are the inside and the outside relative to an outline of each part.

In order to facilitate description, a spatial relative term may be used here, such as "over", "above", "on an upper surface" and "on", to describe a spatial location relation between a device or a feature shown in the drawing and other devices or other features. It is to be understood that the spatial relative term aims at including different orientations of the device during use or operation outside the orientation described in the drawing. For example, if the device in the drawing is inverted, it may be described as that the device "above other devices or other structures" or "over other devices or other structures" shall be positioned "under other devices or other structures" or "below other devices or other structures". Therefore, an exemplary term "above" may include two orientations: "above" and "under". As an alternative, the device may be positioned with other different modes (90° rotation or positioned at other orientations), and the spatial relative description used here needs to be explained correspondingly.

In addition, it should be noted that terms "first", "second" and the like are used for limiting the parts, for facilitating distinguishing corresponding parts only. Unless otherwise stated, the above terms do not have special meanings, and accordingly should not be understood to limit the scope of protection of the disclosure.

The above is only preferred embodiments of the disclosure and is not intended to limit the disclosure. Those skilled in the art may make various modifications and variations. Any modifications, equivalent replacements, improvements and the like made within the spirit and principle of the disclosure shall fall within the scope of protection of the disclosure.

The invention claimed is:

1. An LED display device, comprising:
a rectangle framework, comprising a frame, a first transverse beam and a second transverse beam arranged inside the frame at intervals, and a strip-like gap being formed by the first transverse beam, the second transverse beam and a part of the frame;
an adapter plate assembly, comprising a fixed plate mounted at the strip-like gap and an adapter plate detachably arranged on a rear side of the fixed plate, and the fixed plate being provided with a lock; and
a display module, mounted on a front side of the rectangle framework through a magnetic attraction structure, and a rear side of the display module being provided with a first strip-shaped lock hole,
wherein, the lock comprises a rotary shaft rotatably arranged on the fixed plate and a first lock tongue arranged on the rotary shaft, the first lock tongue is able to go through the first strip-shaped lock hole and has a first unlocking position corresponding to the first strip-shaped lock hole and a first locking position that is staggered with the first strip-shaped lock hole, and the adapter plate fits the display module through a connector in a plugging-in manner.

2. The LED display device as claimed in claim 1, wherein, the adapter plate is provided with a second strip-shaped lock hole, and the lock further comprises a second lock tongue arranged on the rotary shaft; the second lock tongue is able to go through the second strip-shaped lock hole and has a second unlocking position corresponding to the second strip-shaped lock hole and a second locking position that is staggered with the second strip-shaped lock hole, wherein, the second lock tongue is located at the second unlocking position when the first lock tongue is located at the first locking position, and the second lock tongue is located at the second locking position when the first lock tongue is located at the first unlocking position.

3. The LED display device as claimed in claim 2, wherein, the first lock tongue is arranged on a front end of the rotary shaft, the second lock tongue is arranged on a rear end of the rotary shaft, the first strip-shaped lock hole and the second strip-shaped lock hole are arranged correspondingly, and the second lock tongue and the first lock tongue are arranged perpendicularly.

4. The LED display device as claimed in claim 2, wherein, the lock further comprises a lock seat arranged on the fixed plate, and the rotary shaft is rotatably arranged on the lock seat; and the first lock tongue is of column-shaped, and the second lock tongue is of block-shaped.

5. The LED display device as claimed in claim 1, wherein, the display module comprises a lamp panel and a rear plate arranged on a rear side of the lamp panel; the first strip-shaped lock hole is arranged on the rear plate, the fixed plate is provided with a via hole of avoiding the connector, and the connector comprises a female connector arranged on the lamp panel and a male connector arranged on the adapter plate.

6. The LED display device as claimed in claim 1, wherein, each of the first transverse beam and the second transverse beam comprises a first transverse section, a second transverse section and a third transverse section that are connected in sequence;
a distance between the second transverse section of the first transverse beam and the second transverse section of the second transverse beam is greater than a distance between the first transverse section of the first transverse beam and the first transverse section of the second transverse beam, and the distance between the second transverse section of the first transverse beam and the second transverse section of the second transverse beam is greater than a distance between the third transverse section of the first transverse beam and the third transverse section of the second transverse beam.

7. The LED display device as claimed in claim 1, wherein, the frame comprises a first vertical side section, a first transverse side section, a second vertical side section and a second transverse side section that are connected in sequence; the first transverse beam and the second transverse beam are arranged at intervals in a vertical direction; two ends of the first transverse beam are connected with the first vertical side section and the second vertical side section respectively, two ends of the second transverse beam are connected with the first vertical side section and the second vertical side section respectively, and the strip-like gap is enclosed by the first transverse beam, the second transverse beam, a part of the first vertical side section and a part of the second vertical side section;
the rectangle framework further comprises a plurality of first longitudinal beams located in the frame, the plurality of first longitudinal beams are arranged at intervals along a length direction of the rectangle framework, and two ends of each first longitudinal beam are connected onto the first transverse side section and the first transverse beam respectively;
a first rectangle hole is enclosed by the first longitudinal beam that is nearest to the first vertical side section, a part of the first transverse beam, a part of the first vertical side section and a part of the first transverse side section, a second rectangle hole is enclosed by the first longitudinal beam that is nearest to the second vertical side section, a part of the first transverse beam, a part of the second vertical side section and a part of the first transverse side section, and a third rectangle hole is enclosed by two adjacent first longitudinal beams, a part of the first transverse beam and a part of the first transverse side section; the first rectangle hole has a same shape as that of the second rectangle hole; a minimal cross section area of the first rectangle hole is greater than a maximal cross section area of the third rectangle hole, and a diagonal distance of the first rectangle hole is greater than a width of the display module.

8. The LED display device as claimed in claim 7, wherein, the rectangle framework further comprises a plurality of second longitudinal beams located in the frame, the plurality of second longitudinal beams are arranged at intervals along a length direction of the frame, and two ends of each second longitudinal beam are connected onto the second transverse side section and the second transverse beam respectively;
a fourth rectangle hole is enclosed by the second longitudinal beam that is nearest to the first vertical side section, a part of the second transverse beam a part of the first vertical side section and a part of the second transverse side section, a fifth rectangle hole is enclosed by the second longitudinal beam that is nearest to the second vertical side section, a part of the second transverse beam, a part of the second vertical side section and a part of the second transverse side section, and a sixth rectangle hole is enclosed by two adjacent second longitudinal beams, a part of the second transverse beam and a part of the second transverse side section; the fourth rectangle hole has a same shape as that of the fifth rectangle hole; a minimal cross section area of the fourth rectangle hole is greater than a maximal cross section area of the sixth rectangle hole; and a diagonal distance of the fourth rectangle hole is greater than the width of the display module.

9. The LED display device as claimed in claim 1, wherein, there are a plurality of display modules and a plurality of magnetic attraction structures, and each display module is spliced on the front side of the rectangle framework through the plurality of magnetic attraction structures.

10. The LED display device as claimed in claim 9, wherein, a front side of the frame, a front side of the first transverse beam and a front side of the second transverse beam are provided with a plurality of fixed seats, respectively; each of the plurality of magnetic attraction structures comprises a first magnetic attraction parts arranged on one fixed seat and a second magnetic attraction part arranged on the rear side of the display module; the first magnetic attraction part fits the second magnetic attraction part in a magnetic attraction manner; and front sides of the first magnetic attraction parts of the plurality of magnetic attraction structures are coplanar.

* * * * *